US012245454B2

(12) United States Patent
Choi et al.

(10) Patent No.: US 12,245,454 B2
(45) Date of Patent: *Mar. 4, 2025

(54) DISPLAY PANEL

(71) Applicant: SAMSUNG DISPLAY CO., LTD., Yongin-si (KR)

(72) Inventors: Minhee Choi, Yongin-si (KR); Wonkyu Kwak, Yongin-si (KR); Youngsoo Yoon, Yongin-si (KR); Yunkyeong In, Yongin-si (KR); Hyunji Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 274 days.

This patent is subject to a terminal disclaimer.

(21) Appl. No.: 17/820,022

(22) Filed: Aug. 16, 2022

(65) Prior Publication Data
US 2022/0393138 A1    Dec. 8, 2022

Related U.S. Application Data

(63) Continuation of application No. 16/791,359, filed on Feb. 14, 2020, now Pat. No. 11,417,864.

(30) Foreign Application Priority Data

Mar. 5, 2019  (KR) ........................ 10-2019-0025385

(51) Int. Cl.
  *H10K 50/844*    (2023.01)
  *H10K 50/84*    (2023.01)
  (Continued)

(52) U.S. Cl.
  CPC ......... *H10K 50/8445* (2023.02); *H10K 50/84* (2023.02); *H10K 50/844* (2023.02); *H10K 59/00* (2023.02); *H10K 71/00* (2023.02)

(58) Field of Classification Search
  CPC .. H10K 50/84; H10K 50/844; H10K 50/8445; H10K 59/00; H10K 59/12; H10K 59/40
  See application file for complete search history.

(56) References Cited

U.S. PATENT DOCUMENTS

| 8,659,224 | B1 | 2/2014 | Moon |
| 8,916,876 | B2 | 12/2014 | Jeon et al. |

(Continued)

FOREIGN PATENT DOCUMENTS

| CN | 106935626 A | 7/2017 |
| CN | 107039493 A | 8/2017 |

(Continued)

OTHER PUBLICATIONS

Office Action dated Dec. 6, 2021 in corresponding U.S. Appl. No. 16/791,359.

(Continued)

*Primary Examiner* — Tuan A Hoang
(74) *Attorney, Agent, or Firm* — F. Chau & Associates, LLC

(57) ABSTRACT

A display apparatus includes a first area including at least one opening, a second area disposed around the first area, and a third area disposed between the first area and the second area. The second area includes a plurality of display elements, and the third area includes a groove. The display apparatus further includes a thin film encapsulation layer covering the plurality of display elements and including an inorganic encapsulation layer and an organic encapsulation layer, a planarization layer disposed over the groove, a first insulating layer disposed over the thin film encapsulation layer, a second insulating layer disposed over the planarization layer, and a cover layer overlapping the first end of the planarization layer and partially overlapping the first insulating layer and the second insulating layer. A first end of the planarization layer overlaps the thin film encapsulation (Continued)

layer, and the second insulating layer includes a first through hole.

23 Claims, 28 Drawing Sheets

(51) Int. Cl.
*H10K 59/00* (2023.01)
*H10K 71/00* (2023.01)

(56) References Cited

U.S. PATENT DOCUMENTS

| | | | |
|---|---|---|---|
| 9,570,702 | B2 | 2/2017 | Hong |
| 9,935,159 | B2 | 4/2018 | Lee et al. |
| 9,941,338 | B2 | 4/2018 | Seo et al. |
| 10,304,913 | B2 | 5/2019 | Choi et al. |
| 10,340,317 | B2 | 7/2019 | Oh et al. |
| 10,535,825 | B2 | 1/2020 | Tanaka |
| 10,600,854 | B2 | 3/2020 | Kim et al. |
| 11,417,864 | B2 * | 8/2022 | Choi ................ H10K 59/87 |
| 2012/0169217 | A1 | 7/2012 | Kim et al. |
| 2013/0293096 | A1 | 11/2013 | Kang et al. |
| 2016/0248039 | A1 | 8/2016 | Choung et al. |
| 2016/0306472 | A1 | 10/2016 | Park et al. |
| 2017/0148856 | A1 * | 5/2017 | Choi ................ H10K 59/873 |
| 2017/0162637 | A1 | 6/2017 | Choi et al. |
| 2017/0278901 | A1 | 9/2017 | Kim et al. |
| 2018/0183015 | A1 | 6/2018 | Yun et al. |
| 2020/0168683 | A1 * | 5/2020 | Son ................ H10K 77/10 |
| 2020/0287164 | A1 | 9/2020 | Choi et al. |

FOREIGN PATENT DOCUMENTS

| | | |
|---|---|---|
| CN | 107275506 A | 10/2017 |
| CN | 107783691 A | 3/2018 |
| EP | 3176771 | 7/2017 |
| EP | 3293765 | 3/2018 |
| KR | 10-2014-0032268 | 3/2014 |
| KR | 10-2015-0124541 | 11/2015 |
| KR | 10-2016-0090456 | 8/2016 |
| KR | 10-1739384 | 5/2017 |
| KR | 10-2018-0060311 | 6/2018 |
| WO | 2018138779 | 8/2018 |

OTHER PUBLICATIONS

Notice of Allowance dated Apr. 11, 2022 in corresponding U.S. Appl. No. 16/791,359.

* cited by examiner

DISPLAY PANEL

CROSS-REFERENCE TO RELATED APPLICATIONS

This application is a continuation of U.S. patent application Ser. No. 16/791,359 filed Feb. 14, 2020, which claims priority under 35 U.S.C. § 119 to Korean Patent Application No. 10-2019-0025385, filed on Mar. 5, 2019 in the Korean Intellectual Property Office, the disclosures of which are incorporated by reference herein in their entirety.

TECHNICAL FIELD

One or more embodiments relate to a display panel including a first area and/or an opening, and a display apparatus including the display panel.

DISCUSSION OF THE RELATED ART

As display apparatuses become thinner and lighter, their use for various applications has increased.

Although efforts are being made to increase the display area of a display apparatus and decrease the non-display area, various functions associated with the display apparatus have been added to devices utilizing the display apparatus. Some of these functions require components that are typically disposed in the non-display area. However, as the size of the display area increases and the size of the non-display area decreases, there may be insufficient space in the non-display area to dispose these components. As a result, display apparatuses including an opening in the display area for the placement of such components are being developed.

SUMMARY

In general, a display apparatus including an opening may have problems such as, for example, lifting or exfoliation of a film around the opening, resulting from a structure of the opening and components around the opening. One or more embodiments are directed to a display panel including an opening with increased quality that may prevent or reduce such problems.

According to an embodiment, a display apparatus includes a first area including at least one opening, a second area disposed around the first area, and a third area disposed between the first area and the second area. The second area includes a plurality of display elements, and the third area includes a groove. The display apparatus further includes a thin film encapsulation layer covering the plurality of display elements and including an inorganic encapsulation layer and an organic encapsulation layer, a planarization layer disposed over the groove, a first insulating layer disposed over the thin film encapsulation layer, a second insulating layer disposed over the planarization layer, and a cover layer overlapping the first end of the planarization layer and partially overlapping the first insulating layer and the second insulating layer. A first end of the planarization layer overlaps the thin film encapsulation layer, and the second insulating layer includes a first through hole.

In an embodiment, the planarization layer includes an organic insulating material.

In an embodiment, the cover layer includes a conductive material.

In an embodiment, the cover layer includes a second through hole.

In an embodiment, the first through hole and the second through hole at least partially overlap each other.

In an embodiment, the first through hole and the second through hole have substantially a same size.

In an embodiment, the first insulating layer includes an inorganic insulating material.

In an embodiment, the second insulating layer includes an inorganic insulating material.

In an embodiment, a width of a first portion of the cover layer that does not cover the planarization layer is less than a width of a second portion of the cover layer that covers the planarization layer.

In an embodiment, the inorganic encapsulation layer of the thin film encapsulation layer covers the groove, and the first insulating layer covers the inorganic encapsulation layer.

In an embodiment, the display apparatus further includes a first partition wall disposed in the third area. The first partition wall includes a plurality of insulating layers, and the planarization layer is disposed over the first partition wall.

According to an embodiment, a display apparatus includes a first area including at least one opening, a second area disposed around the first area, and a third area disposed between the first area and the second area. The second area includes a plurality of display elements. The display apparatus further includes a thin film encapsulation layer covering the plurality of display elements, a planarization layer disposed in the third area, a first insulating layer disposed over the thin film encapsulation layer, a second insulating layer disposed over the planarization layer, and an input sensing layer disposed over the plurality of display elements. A first end of the planarization layer overlaps the thin film encapsulation layer, and the second insulating layer includes a first through hole.

In an embodiment, the input sensing layer includes a first conductive layer including a first connection electrode, a second conductive layer including a first sensing electrode, a second sensing electrode, and a second connection electrode, and an interlayer insulating layer disposed between the first conductive layer and the second conductive layer.

In an embodiment, the display apparatus further includes a cover layer overlapping the first end of the planarization layer, and partially overlapping the first insulating layer and the second insulating layer. The cover layer is on a same layer as the first conductive layer or the second conductive layer.

In an embodiment, the cover layer includes a same material as the first conductive layer or the second conductive layer.

In an embodiment, the display apparatus further includes a third insulating layer covering the cover layer. The third insulating layer is integrally formed with the interlayer insulating layer.

In an embodiment, the cover layer includes a second through hole.

In an embodiment, the first through hole and the second through hole at least partially overlap each other.

In an embodiment, the third area includes a groove, and the planarization layer is disposed over the groove.

In an embodiment, the planarization layer includes an organic insulating material.

In an embodiment, the thin film encapsulation layer includes at least one inorganic encapsulation layer and at least one organic encapsulation layer, and the at least one inorganic encapsulation layer of the thin film encapsulation layer covers the groove.

In an embodiment, the first insulating layer includes an inorganic insulating material.

In an embodiment, the second insulating layer includes an inorganic insulating material.

BRIEF DESCRIPTION OF THE DRAWINGS

The above and other features will become apparent by describing in detail One or more embodiments thereof with reference to the accompanying drawings, in which.

DETAILED DESCRIPTION

Figure 1:
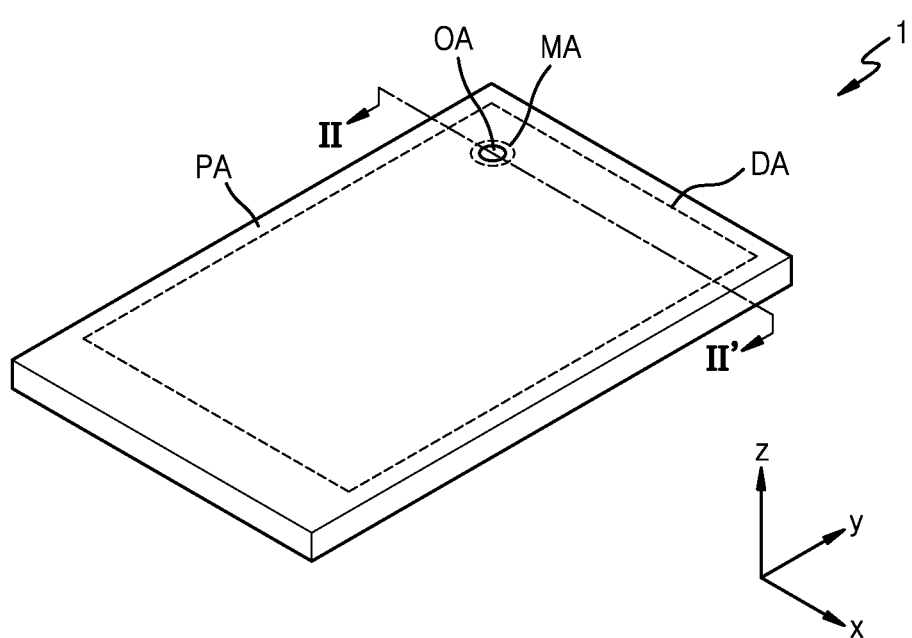
FIG. 1 is a schematic perspective view of a display apparatus according to an embodiment.

Exemplary embodiments will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

The singular forms "a", "an", and "the" used herein are intended to include the plural forms as well, unless the context clearly indicates otherwise.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements should be interpreted in a like fashion.

When an embodiment may be implemented differently, a certain process order may be performed differently from the described order. For example, two consecutively described processes may be performed substantially at the same time or performed in an order opposite to the described order.

When layers, regions, or components are "connected", the layers, regions, or components may not only be "directly connected" but may also be "indirectly connected" via another layer, region, or component. For example, when layers, regions, or components are electrically connected, the layers, regions, or components may not only be directly electrically connected but may also be indirectly electrically connected via another layer, region, or component.

When two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. For example, when two or more elements or values are substantially the same as or about equal to each other but are not identical to each other, it is to be understood that the two or more elements or values are approximately the same as or equal to each other within a measurement error as would be understood by a person having ordinary skill in the art.

FIG. 1 is a schematic perspective view of a display apparatus 1 according to an embodiment.

Referring to FIG. 1, the display apparatus 1 includes a first area OA (an opening area) and a second area DA (a display area). The second area DA at least partially surrounds the first area OA.

The display apparatus 1 may provide an image by using light emitted from a plurality of pixels disposed in the second area DA. The first area OA may be entirely surrounded by the second area DA. The first area OA may be an area in which a component 20 (refer to FIG. 2) is disposed.

A third area MA (a middle area) may be disposed between the first area OA and the second area DA, and the second area DA may be surrounded by a fourth area PA (a peripheral area).

The third area MA and the fourth area PA may be non-display areas in which no pixels are disposed. The third area MA may be entirely surrounded by the second area DA, and the second area DA may be entirely surrounded by the fourth area PA.

Although the display apparatus 1 is described herein as being an organic light-emitting display apparatus, embodiments are not limited thereto. For example, according to embodiments, the display apparatus 1 may be a liquid crystal display apparatus, an inorganic light-emitting display apparatus, or a quantum dot light-emitting display apparatus.

Although FIG. 1 shows one first area OA that is substantially circular, the number and shape of the first area OA is not limited thereto. For example, according to One or more embodiments, the number of first areas OA may be two or more, and each first area OA may be variously changed to have, for example, a circular shape, an oval shape, a polygonal shape such as a triangular or tetragonal shape, a star shape, a diamond shape, or an atypical shape, on the plane (or in a direction vertical to a main surface of a substrate).

The display apparatus 1 may be implemented in various electronic devices such as, for example, a mobile phone, a notebook computer, or a smartwatch.

Figure 2:
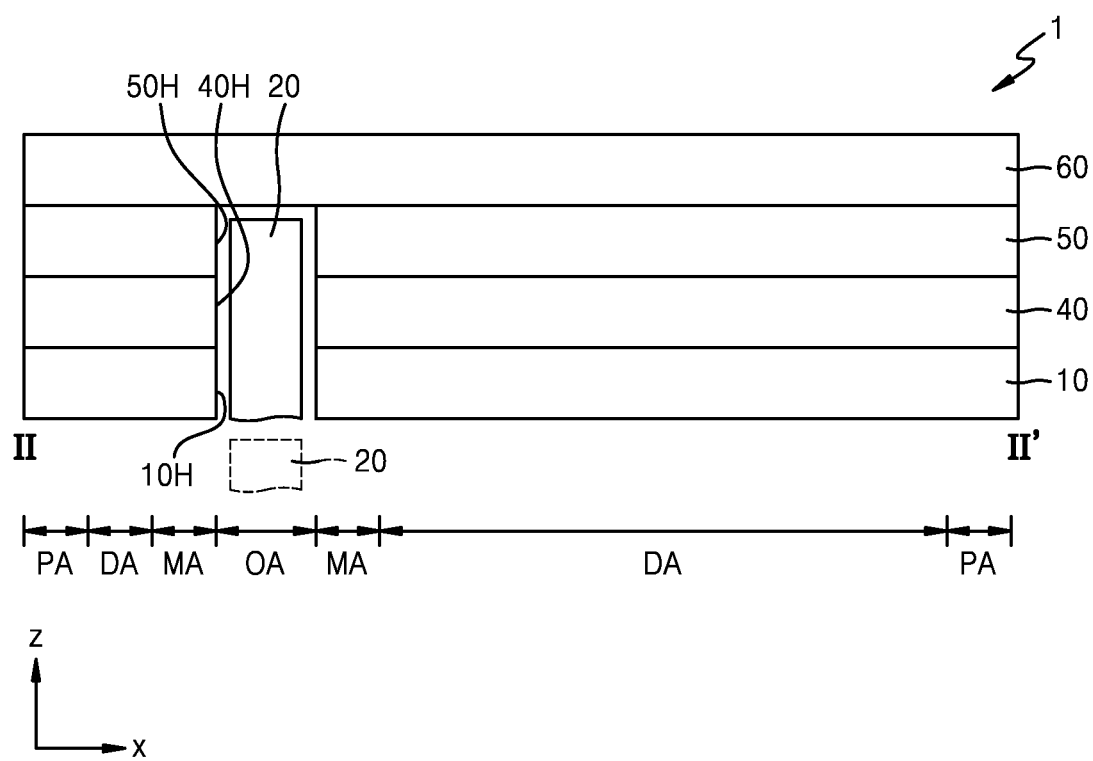
FIG. 2 is a schematic cross-sectional view of the display apparatus of FIG. 1 taken along line II-II', according to an embodiment.

FIG. 2 is a schematic cross-sectional view of the display apparatus 1 of FIG. 1 taken along line II-II', according to an embodiment.

Referring to FIG. 2, the display apparatus 1 may include a display panel 10, an input sensing layer 40, an optical function layer 50, and a window 60.

The display panel 10 may display an image. The display panel 10 includes pixels disposed in the second area DA (the display area). The pixels may include a display element and a pixel circuit connected thereto. The display element may include, for example, an organic light-emitting diode. Alternatively, the display element may include an inorganic light-emitting diode, a quantum dot light-emitting diode, etc.

The input sensing layer 40 obtains coordinate information according to an external input such as, for example, a touch event. The input sensing layer 40 may include a sensing electrode or touch electrode, and trace lines connected to the sensing electrode or touch electrode. The input sensing layer 40 may be disposed on the display panel 10. The input sensing layer 40 may sense an external input using, for example, a mutual-capacitance method and/or a self-capacitance method.

The input sensing layer 40 may be directly disposed on the display panel 10. The input sensing layer 40 may be formed with the display panel 10 in the same process, or may be formed through a separate process and be combined with the display panel 10 via an adhesive layer such as, for example, an optical clear adhesive (OCA). For example, after manufacturing processes of the display panel 10 are completed, the input sensing layer 40 may be formed by consecutively implementing a direct deposition process and/or an extra patterning process on the display panel 10. In this case, there may be no adhesive layer between the input sensing layer 40 and the display panel 10.

Although FIG. 2 shows the input sensing layer 40 disposed between the display panel 10 and the optical function layer 50, embodiments are not limited thereto. For example, in an embodiment, the input sensing layer 40 may be disposed on the optical function layer 50.

The optical function layer 50 may include a reflection-preventing layer. The reflection-preventing layer may decrease reflectance of incident light (external light) moving from the outside toward the display panel 10 through the window 60.

The reflection-preventing layer may include a retarder and a polarizer. The retarder may be of a film type or a liquid crystal coating type, and may include a λ/2 retarder and/or a λ/4 retarder. The polarizer may be of a film type or a liquid crystal coating type. The film type may include a stretchable synthetic resin film, and the liquid crystal coating type may include liquid crystals in a predetermined arrangement.

The retarder and the polarizer may further include a protective film. The retarder and the polarizer themselves or the protective film may be defined as a base layer of the reflection-preventing layer.

In an embodiment, the reflection-preventing layer may include a black matrix and color filters. The color filters may be disposed by taking into account a color of light emitted from each pixel of the display panel 10.

In an embodiment, the reflection-preventing layer may include a destructive interference structure. The destructive interference structure may include a first reflective layer and a second reflective layer disposed on different layers from each other. First reflected light and second reflected light respectively reflected from the first reflective layer and the second reflective layer may experience destructive interference, and thus, reflectance of external light may decrease.

The optical function layer 50 may include a lens layer. The lens layer may increase light output efficiency of light emitted from the display panel 10 or may decrease color deviation. The lens layer may include a layer having a concave or convex lens shape and/or may include a plurality of layers having different refractive indexes from each other. The optical function layer 50 may include both of the above-described reflection-preventing layer and the lens layer, or may include one of the above-described reflection-preventing layer and the lens layer.

The display panel 10, the input sensing layer 40, and the optical function layer 50 may include an opening. In this regard, FIG. 2 shows the display panel 10, the input sensing layer 40, and the optical function layer 50 respectively including first to third openings 10H, 40H, and 50H overlapping one another.

The first to third openings 10H, 40H, and 50H may correspond to the first area OA (an opening area). For example, the first area OA may be formed by the first to third openings 10H, 40H, and 50H. Sizes (or diameters) of the first to third openings 10H, 40H, and 50H may be the same as or different from one another.

In an embodiment, at least one of the display panel 10, the input sensing layer 40 and/or the optical function layer 50 may include no opening. For example, one or two components selected from among the display panel 10, the input sensing layer 40, and the optical function layer 50 may include no opening. Thus, the first area OA may be formed by some, but not all, of the first to third openings 10H, 40H, and 50H.

The first area OA may be a component area (e.g. a sensor area, a camera area, a speaker area, etc.) in which a component 20 such as, for example, a sensor, a camera, a speaker, etc. for adding various functions to the display apparatus 1 is located.

As denoted by a solid line in FIG. 2, the component 20 may be disposed in the first to third openings 10H, 40H, and 50H. Alternatively, as denoted by a dashed line, the component 20 may be disposed below the display panel 10, and thus, not within any of the first to third openings 10H, 40H, and 50H. In this case, one or more from among the display panel 10, the input sensing layer 40, and the optical function layer 50 may include no opening. That is, in this case, at least one of the first to third openings 10H, 40H, and 50H may not be included.

The component 20 may include an electronic element. For example, the component 20 may be an electronic element using light or sound.

For example, the electronic element may include a sensor, such as an infrared sensor, using light, a camera receiving light to capture an image, a sensor outputting and sensing light or sound to measure a distance or recognize a fingerprint, etc., a small lamp outputting light, a speaker outputting sound, etc. The electronic element using light may use light within various wavelength ranges, such as visible light, infrared light, ultraviolet light, etc. In some embodiments, the first area OA may be a transmission area capable of transmitting light and/or sound output from the component 20 to the outside or travelling from the outside toward the electronic element.

In an embodiment, when the display apparatus 1 is used to implement, for example, a smartwatch or a vehicle-use dashboard, the component 20 may be a member including clock hands, a needle indicating predetermined information (e.g. a vehicle speed, etc.), etc. When the display apparatus 1 includes the component 20 such as clock hands or a vehicle-use dashboard, the component 20 may be externally exposed through the window 60, and the window 60 may include an opening corresponding to the first area OA. Alternatively, even when the display apparatus 1 includes the component 20 that does not include clock hands or a vehicle-use dashboard (e.g., when the component is a speaker), the window 60 may include an opening corresponding to the first area OA.

The component 20 may include a component (components) related to a function of the display panel 10 as described above, or may include a component such as an accessory increasing an aesthetic sense of the display panel 10.

A layer including an adhesive layer such as, for example, an OCA, may be disposed between the window 60 and the optical function layer 50.

Figure 3:
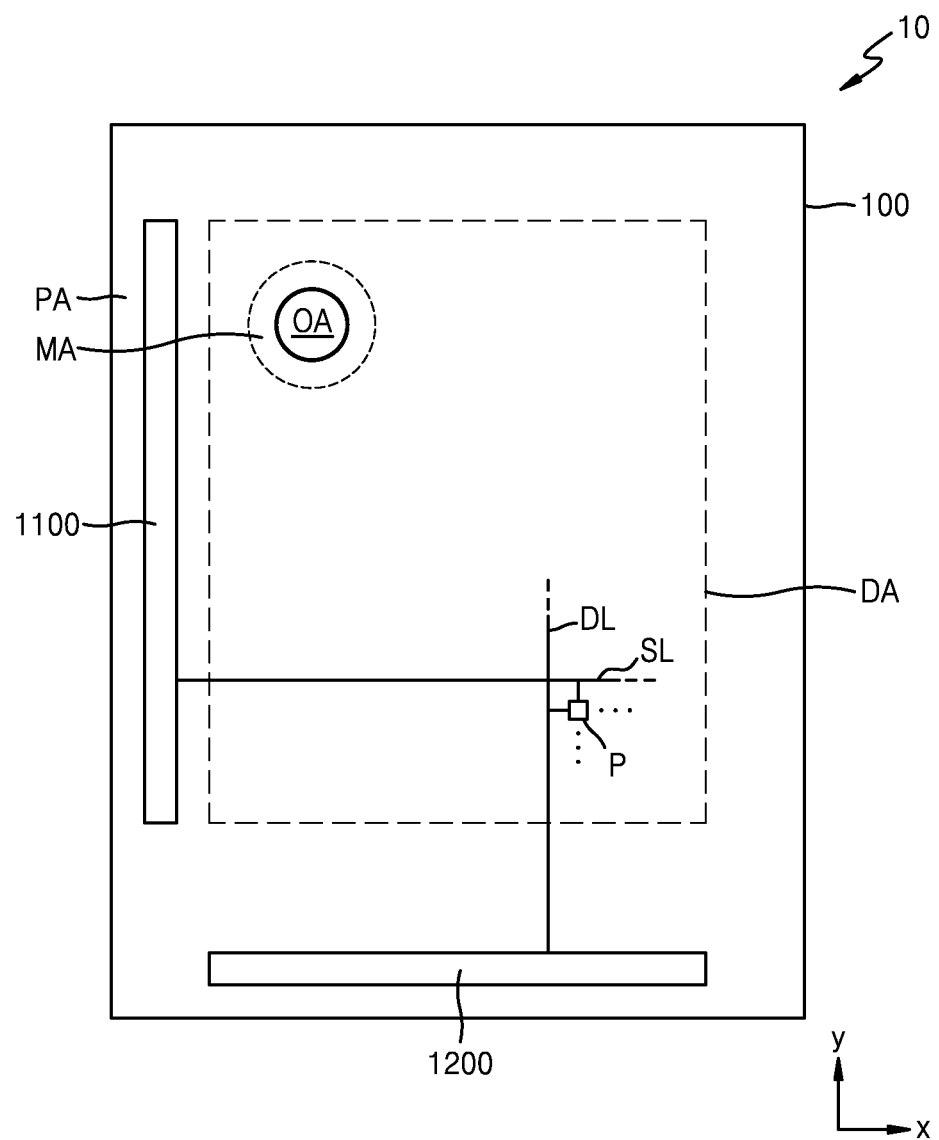
FIG. 3 is a schematic plan view of a display panel, according to an embodiment.
Figure 4:
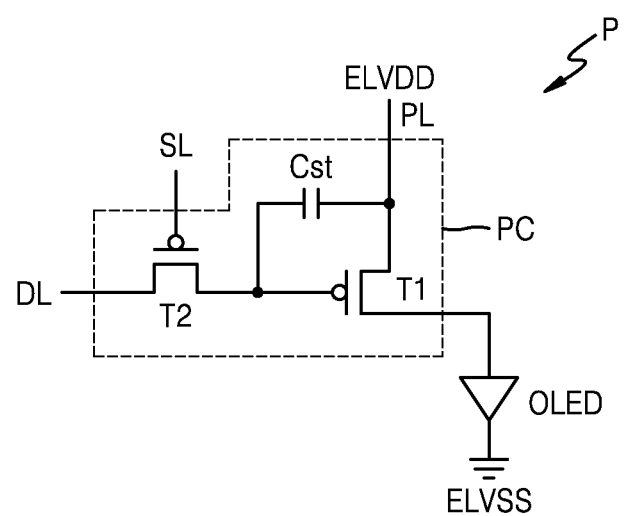
FIG. 4 is an equivalent circuit diagram schematically illustrating a pixel of a display panel, according to an embodiment.

FIG. 3 is a schematic plan view of the display panel 10 of FIG. 2, according to an embodiment. FIG. 4 is an equivalent circuit diagram schematically illustrating a pixel P of the display panel 10, according to an embodiment.

Referring to FIG. 3, the display panel 10 includes the first area OA (an opening area), the second area DA (a display area), the third area MA (a middle area), and the fourth area PA (a peripheral area). FIG. illustrates a substrate 100 of the display panel 10. For example, the substrate 100 includes the first area OA, the second area DA, the third area MA, and the fourth area PA.

The display panel 10 includes a plurality of pixels P disposed in the second area DA. As shown in FIG. 4, each pixel P includes a pixel circuit PC and an organic light-emitting diode OLED, which is a display element connected to the pixel circuit PC.

The pixel circuit PC may include a first thin film transistor T1, a second thin film transistor T2, and a storage capacitor Cst. Each pixel P may emit, for example, red, green, blue, or white light through the organic light-emitting diode OLED.

The second thin film transistor T2, which is a switching thin film transistor, may be connected to a scan line SL and a data line DL, and may deliver a data voltage input from the data line DL to the first thin film transistor T1 according to a switching voltage input from the scan line SL. The storage capacitor Cst may be connected to the second thin film transistor T2 and a driving voltage line PL, and may store a voltage corresponding to a difference between a voltage received from the second thin film transistor T2 and a first power voltage ELVDD supplied to the driving voltage line PL.

The first thin film transistor T1, which is a driving thin film transistor, may be connected to the driving voltage line PL and the storage capacitor Cst, and may control a driving current flowing from the driving voltage line PL through the organic light-emitting diode OLED in response to a voltage value stored in the storage capacitor Cst. The driving current may allow the organic light-emitting diode OLED to emit light having a predetermined brightness. An opposite electrode (e.g. a cathode) of the organic light-emitting diode OLED may receive a second power voltage ELVSS.

Although the pixel circuit PC illustrated in FIG. 4 includes two thin film transistors and one storage capacitor, embodiments are not limited thereto. For example, the number of thin film transistors and the number of storage capacitors may variously change according to design of the pixel circuit PC.

Referring again to FIG. 3, the third area MA may surround the first area OA. The third area MA is an area in which a display element such as an organic light-emitting diode emitting light is not disposed, and signal lines for providing signals to the pixels P disposed around the first area OA may pass the third area MA.

A scan driver 1100 providing a scan signal to each pixel P, a data driver 1200 providing a data signal to each pixel P, a main power line for providing first and second power voltages, etc. may be disposed in the fourth area PA (a peripheral area). Although the data driver 1200 is disposed adjacent to a lateral side of the substrate 100 in FIG. 3, embodiments are not limited thereto. For example, in an embodiment, the data driver 1200 may be disposed on a flexible printed circuit board (FPCB) electrically connected to a pad disposed on a side of the display panel 10.

Figure 5:
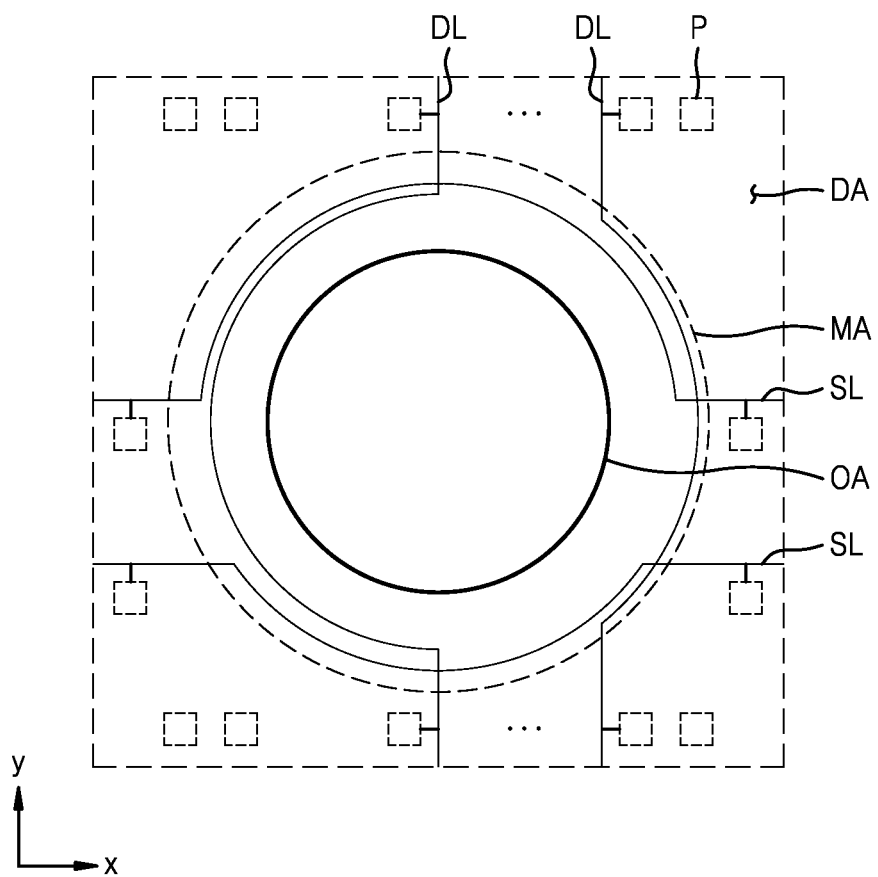
FIG. 5 is a plan view of a portion of a display panel according to an embodiment, and illustrates signal lines in a third area.

FIG. 5 is a plan view of a portion of a display panel according to an embodiment, and illustrates signal lines in the third area MA (a middle area).

Referring to FIG. 5, the pixels P are disposed in the second area DA, and the third area MA (a middle area) is disposed between the first area OA and the second area DA. The pixels P adjacent to the first area OA may be mutually spaced apart with respect to the first area OA on the plane. The pixels P may be spaced apart vertically with respect to the first area OA or may be spaced apart horizontally with respect to the first area OA.

From among signal lines for supplying signals to the pixels P, signal lines adjacent to the first area OA may detour around the first area OA. Some data lines DL from among data lines passing the second area DA may extend in the y direction to provide data signals to the pixels P respectively disposed above and below the first area OA (with the first area OA disposed therebetween), and may take a detour along the edge of the first area OA over the third area MA.

Some scan lines SL from among scan lines passing the second area DA may extend in the x direction to provide scan signals to the pixels P respectively disposed to the left and right of the first area OA (with the first area OA disposed therebetween), and may take a detour along the edge of the first area OA over the third area MA.

Figure 6:
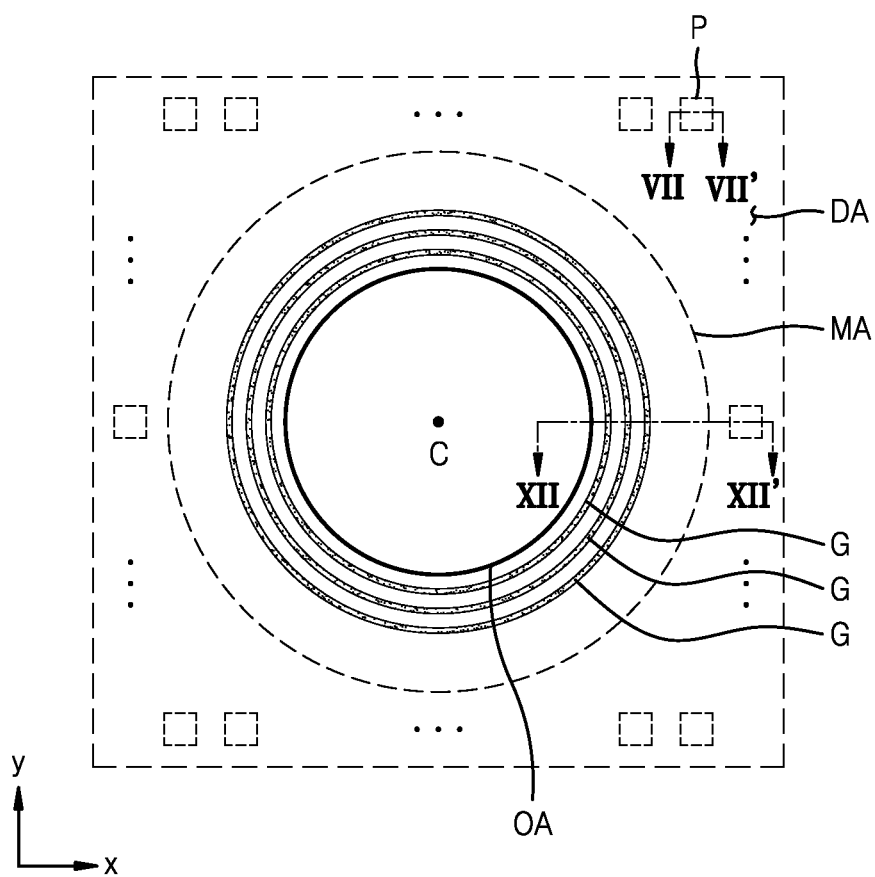
FIG. 6 is a plan view of a portion of a display panel according to an embodiment, and illustrates a groove in a third area.

FIG. 6 is a plan view of a portion of a display panel according to an embodiment, and illustrates a groove G in the third area MA.

Referring to FIG. 6, one or more grooves G may be disposed between the first area OA and the second area DA. Although FIG. 6 shows three grooves G disposed between the first area OA and the second area DA, embodiments are not limited thereto. For example, one, two, or four or more grooves may be disposed in the third area MA according to embodiments.

On the plane, the grooves G may be disposed in the third area MA (a middle area) and may have a ring shape entirely surrounding the first area OA. On the plane, a radius of each of the grooves G to a center C of the first area OA may be greater than a radius of the first area OA. The grooves G may be spaced apart from one another.

Referring to FIGS. 5 and 6, the grooves G may be disposed between the first area OA and the detour portions of the data line DL and/or the scan line SL taking a detour along the edge of the first area OA, and the grooves G may be more adjacent to the first area OA than detour portions of the data line DL and/or the scan line SL taking a detour along the edge of the first area OA.

Figure 7:
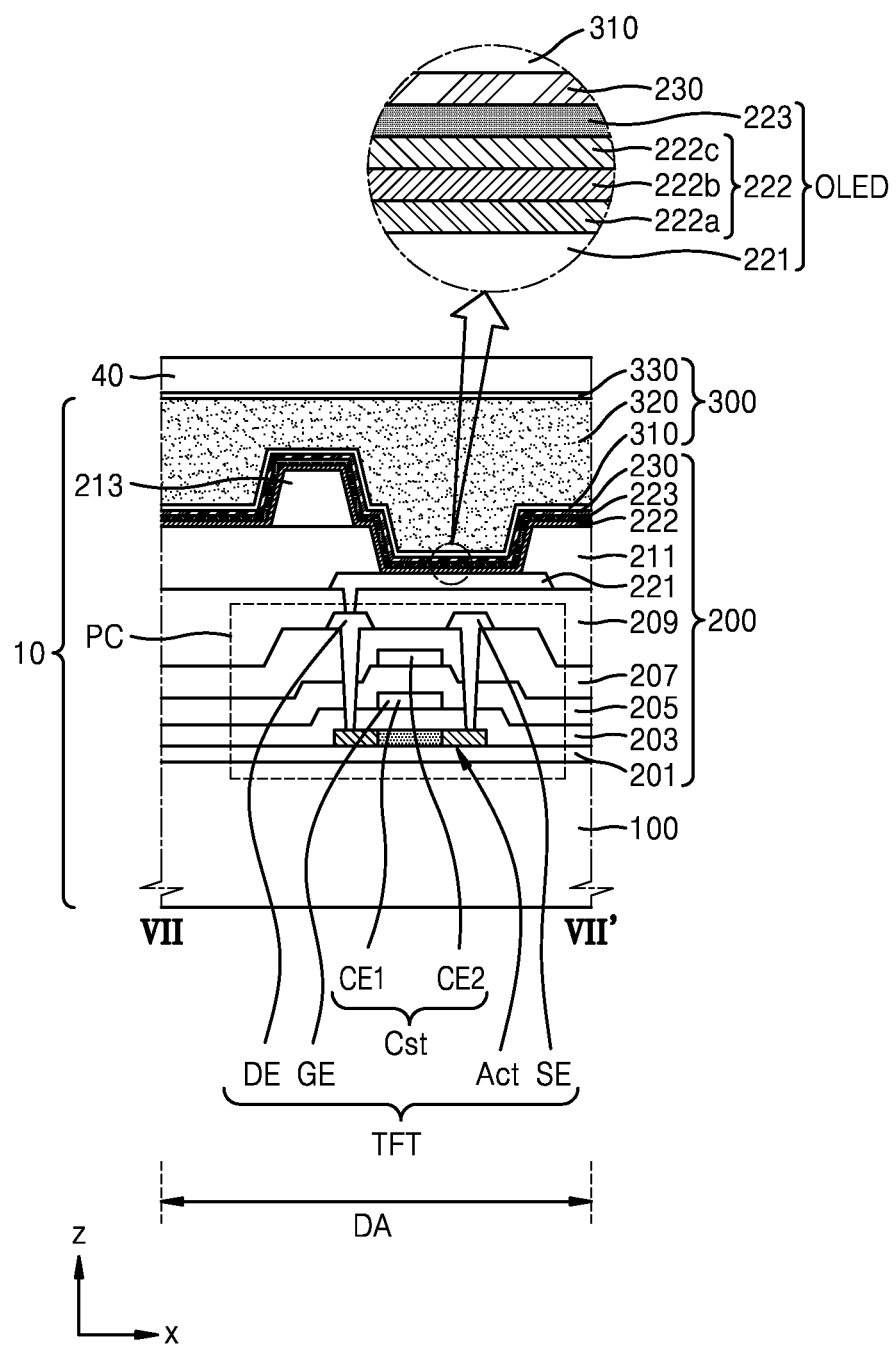
FIG. 7 is a cross-sectional view of the display panel of FIG. 6 taken along line VII-VII', according to an embodiment.

FIG. 7 is a cross-sectional view of the display panel 10 of FIG. 6 taken along line VII-VII', according to an embodiment.

Referring to FIG. 7, the pixel circuit PC and the organic light-emitting diode OLED electrically connected to the pixel circuit PC may be disposed in the second area DA (a display area).

The pixel circuit PC may be disposed on the substrate 100, and the organic light-emitting diode OLED may be disposed on the pixel circuit PC. The pixel circuit PC includes a thin film transistor TFT and the storage capacitor Cst disposed on the substrate 100, and a pixel electrode 221 is electrically connected thereto.

The substrate 100 may include, for example, polymer resin or glass. In an embodiment, the substrate 100 may include polymer resin such as, for example, polyethersulfone, polyacrylate, polyetherimide, polyethylene naphthalate, polyethylene terephthalate, polyphenylene sulfide, polyarylate, polyimide, polycarbonate, cellulose triacetate and/or cellulose acetate propionate, and may have a flexible nature.

In an embodiment, the substrate 100 may include glass including primarily $SiO_2$ or resin such as reinforced plastics, and may have a rigid nature.

The substrate 100 may have a stack structure of a layer including the above-described polymer resin and a barrier layer located on the above-described polymer resin layer. For example, the substrate 100 may have a structure in which a first polymer resin layer, a first barrier layer, a second polymer resin layer, and a second barrier layer are stacked. The substrate 100 including polymer resin may increase flexibility. The barrier layer may include, for example, silicon nitride ($SiN_x$), silicon oxynitride (SiON), silicon oxide ($SiO_x$), etc.

A buffer layer 201, which may prevent permeation of impurities into a semiconductor layer Act of the thin film transistor TFT, may be disposed on the substrate 100. The buffer layer 201 may include an inorganic insulating material such as, for example, silicon nitride, silicon oxynitride, and silicon oxide, and may have a single-layer or multilayer structure including the above-described inorganic insulating material.

The pixel circuit PC may be disposed on the buffer layer 201. The pixel circuit PC includes the thin film transistor TFT and the storage capacitor Cst. The thin film transistor TFT may include the semiconductor layer Act, a gate electrode GE, a source electrode SE, and a drain electrode DE. The thin film transistor TFT shown in FIG. 7 may be a driving thin film transistor, as described above with reference to FIG. 4. Although FIG. 7 illustrates a top-gate type thin film transistor in which the gate electrode GE is disposed on the semiconductor layer Act with a gate insulating layer 203 disposed therebetween, embodiments are not limited thereto. For example, the thin film transistor TFT may be a bottom-gate type thin film transistor in an embodiment.

The semiconductor layer Act may include, for example, polysilicon. Alternatively, the semiconductor layer Act may include, for example, amorphous silicon, may include an oxide semiconductor, or may include an organic semiconductor. The gate electrode GE may include, for example, a low-resistance metal material. The gate electrode GE may include a conductive material including, for example, molybdenum (Mo), aluminum (Al), copper (Cu), titanium (Ti), etc., and may have a single-layer or multilayer structure including the above-described material.

The gate insulating layer 203 disposed between the semiconductor layer Act and the gate electrode GE may include an inorganic insulating material such as, for example, silicon oxide, silicon nitride, silicon oxynitride, aluminum oxide, titanium oxide, tantalum oxide, and hafnium oxide. The gate insulating layer 203 may have a single-layer or multilayer structure including the above-described material.

The source electrode SE and the drain electrode DE may include a highly conductive material. The source electrode SE and the drain electrode DE may include a conductive material including, for example, molybdenum (Mo), aluminum (Al), copper (Cu), titanium (Ti), etc., and may have a multilayer or single-layer structure including the above-described material. In an embodiment, the source electrode SE and the drain electrode DE may include multiple layers of Ti/Al/Ti.

The storage capacitor Cst includes a lower electrode CE1 and an upper electrode CE2 overlapping each other with a first interlayer insulating layer 205 disposed therebetween. In an embodiment, the storage capacitor Cst may overlap the thin film transistor TFT. In this regard, in an embodiment, the gate electrode GE of the thin film transistor TFT may be the lower electrode CE1 of the storage capacitor Cst. In an embodiment, the storage capacitor Cst may not overlap the thin film transistor TFT. The storage capacitor Cst may be covered by a second interlayer insulating layer 207.

The first and second interlayer insulating layers 205 and 207 may include an inorganic insulating material such as, for example, silicon oxide, silicon nitride, silicon oxynitride, aluminum oxide, titanium oxide, tantalum oxide, hafnium oxide, etc. The first and second interlayer insulating layers 205 and 207 may have a single-layer or multilayer structure including the above-described material.

The pixel circuit PC including the thin film transistor TFT and the storage capacitor Cst may be covered by a planarization insulating layer 209. The planarization insulating layer 209 may include a side having a substantially flat upper surface. The planarization insulating layer 209 may include an organic insulating material such as a general-purpose polymer such as, for example, poly(methyl methacrylate) (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof. In an embodiment, the planarization insulating layer 209 may include PI. Alternatively, the planarization insulating layer 209 may include an inorganic insulating material, or may include inorganic and organic insulating materials.

The pixel electrode 221 may be disposed on the planarization insulating layer 209. The pixel electrode 221 may include a conductive oxide such as, for example, indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 221 may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the pixel electrode 221 may further include a film disposed on and/or under the above-described reflective film, the film including ITO, IZO, ZnO, or $In_2O_3$.

A pixel-defining film 211 may be disposed on the pixel electrode 221. The pixel-defining film 211 may include an opening that exposes an upper surface of the pixel electrode 221, and may cover the edge of the pixel electrode 221. The pixel-defining film 211 may include an organic insulating material. Alternatively, the pixel-defining film 211 may include an inorganic insulating material such as, for example, silicon nitride ($SiN_x$), silicon oxynitride (SiON), or silicon oxide ($SiO_x$). Alternatively, the pixel-defining film 211 may include an organic insulating material and an inorganic insulating material.

An intermediate layer 222 includes an emission layer 222b. The intermediate layer 222 may further include a first function layer 222a disposed under the emission layer 222b, and/or a second function layer 222c disposed on the emission layer 222b. The emission layer 222b may include a polymer or low-molecular organic material emitting light having a predetermined color.

The first function layer 222a may have a single-layer or multilayer structure. For example, when the first function layer 222a includes a polymer material, the first function layer 222a may be a hole transport layer (HTL) having a single-layer structure and may include poly-(3,4)-ethylenedihydroxy thiophene (PEDOT) or polyaniline (PANI). When the first function layer 222a includes a low-molecular material, the first function layer 222a may include a hole injection layer (HIL) and an HTL.

The second function layer 222c may be omitted in embodiments. In an embodiment, when the first function layer 222a and the emission layer 222b include a polymer material, the second function layer 222c may be provided. The second function layer 222c may have a single-layer or multilayer structure. The second function layer 222c may include an electron transport layer (ETL) and/or an electron injection layer (EIL).

The emission layer 222b of the intermediate layer 222 may be disposed for each pixel in the second area DA. The emission layer 222b may contact the upper surface of the pixel electrode 221 exposed via the opening in the pixel-defining film 211. Unlike the emission layer 222b, the first and second function layers 222a and 222c of the intermediate layer 222 may be present not only in the second area DA (a display area) of FIG. 7, but also in the third area MA (refer to FIG. 12). For example, in an embodiment, the emission layer 222b is disposed in the second area DA (a display area) and is not disposed in the third area MA, and the first and second function layers 222a and 222c are disposed in the second area DA (a display area) and the third area MA.

An opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), an alloy thereof, etc. Alternatively, the opposite electrode 223 may further include a layer, such as ITO, IZO, ZnO, or $In_2O_3$, disposed on the (semi)transparent layer including the above-described material. The opposite electrode 223 may be disposed over not only the second area DA, but also the third area MA (a middle area). The intermediate layer 222 and the opposite electrode 223 may be formed, for example, by thermal deposition.

A capping layer 230 may be disposed on the opposite electrode 223. The capping layer 230 may include, for example, lithium fluoride (LiF), and may be formed, for example, by thermal deposition. Alternatively, the capping layer 230 may include an inorganic insulating material such as, for example, silicon oxide, silicon nitride, or silicon oxynitride. Alternatively, the capping layer 230 may include an organic insulating material. Alternatively, the capping layer 230 may be omitted.

A spacer 213 may be disposed on the pixel-defining film 211. The spacer 213 may include an organic insulating material such as, for example, PI. Alternatively, the spacer 213 may include an inorganic insulating material such as, for example, silicon nitride or silicon oxide, or may include an organic insulating material and an inorganic insulating material.

The spacer 213 may include a different material than the pixel-defining film 211. Alternatively, the spacer 213 may include the same material as the pixel-defining film 211, and in this case, the pixel-defining film 211 and the spacer 213 may be formed together during a mask process using, for example, a halftone mask. In an embodiment, the pixel-defining film 211 and the spacer 213 may include PI.

The organic light-emitting diode OLED is covered by a thin film encapsulation layer 300. For example, the thin film encapsulation layer 300 is disposed on the organic light-emitting diode OLED. The thin film encapsulation layer 300 may include at least one organic encapsulation layer and at least one inorganic encapsulation layer. In an embodiment, the thin film encapsulation layer 300 includes first and second inorganic encapsulation layers 310 and 330, as well as an organic encapsulation layer 320 disposed between the first and second inorganic encapsulation layers 310 and 330, as shown in FIG. 7. The number of organic encapsulation layers, the number of inorganic encapsulation layers, and the stacking order thereof may be changed according to embodiments.

The first and second inorganic encapsulation layers 310 and 330 may include one or more inorganic insulating materials such as, for example, aluminum oxide, titanium oxide, tantalum oxide, hafnium oxide, zinc oxide, silicon oxide, silicon nitride, or silicon oxynitride, and may be formed by, for example, chemical vapor deposition (CVD).

The organic encapsulation layer 320 may include, for example, polyethylene terephthalate, polyethylene naphthalate, polycarbonate, polyimide, polyethylene sulfonate, polyoxymethylene, polyarylate, hexamethyldisiloxane (HMDSO), acrylic resin (e.g. PMMA, poly(acrylic acid), etc.), or any combination thereof.

The input sensing layer 40 may be disposed on the display panel 10. In an embodiment, the input sensing layer 40 is directly formed on the display panel 10 such that it contacts the thin film encapsulation layer 300, as shown in FIG. 7.

Figure 8:
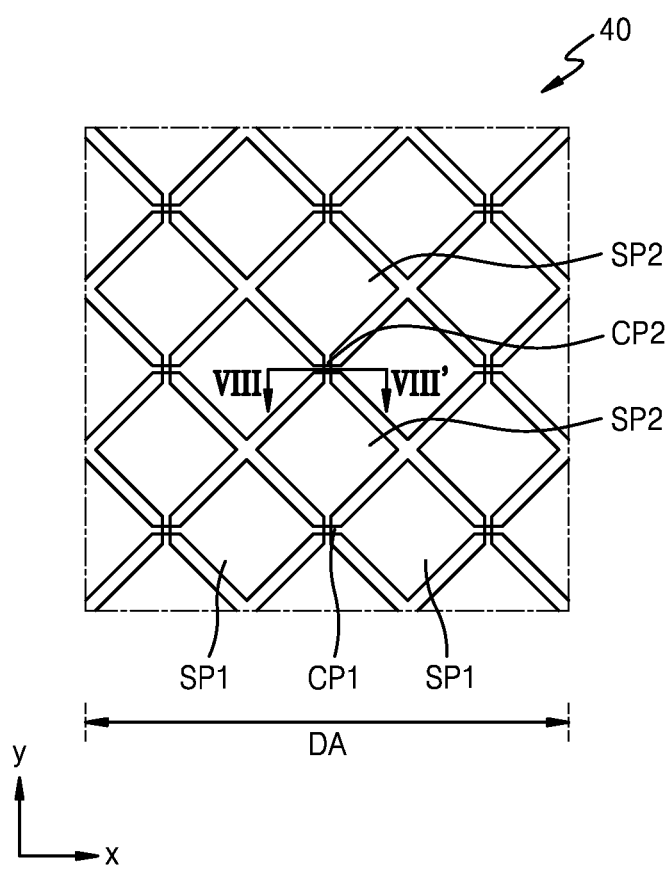
FIG. 8 is a schematic plan view of an input sensing layer, according to an embodiment.

FIG. 8 is a schematic plan view of the input sensing layer 40, according to an embodiment. FIG. 8 shows a portion of the input sensing layer 40 corresponding to the second area DA as shown in FIG. 7.

Referring to FIG. 8, the input sensing layer 40 includes a first sensing electrode SP1 and a second sensing electrode SP2 located in the second area DA. In an embodiment, a plurality of first sensing electrodes SP1 are arranged and connected to each other in the x direction, and a plurality of second sensing electrodes SP2 are arranged and connected to one another in the y direction across the first sensing electrodes SP1. The first sensing electrodes SP1 and the second sensing electrodes SP2 may vertically cross each other.

Corners of the first sensing electrodes SP1 and the second sensing electrodes SP2 may be adjacent to each other. Neighboring first sensing electrodes SP1 may be electrically connected to each other in the x direction via a first connection electrode CP1, and neighboring second sensing electrodes SP2 may be electrically connected to each other in the y direction via a second connection electrode CP2.

Figure 9A:
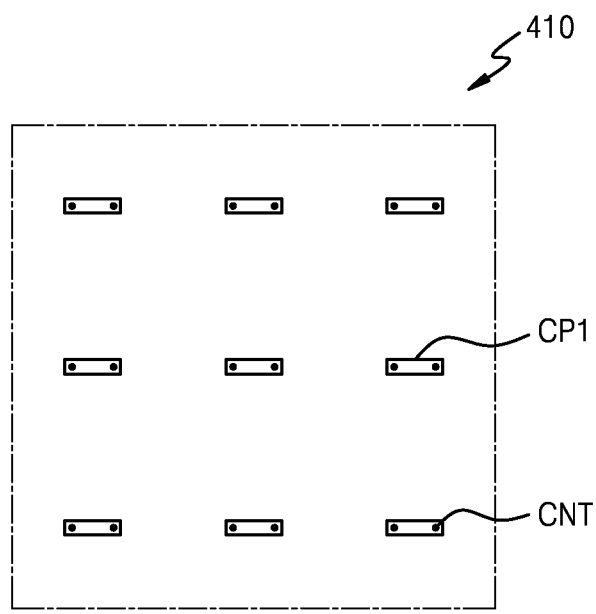
FIGS. 9A and 9B are respective plan views of a first conductive layer and a second conductive layer of an input sensing layer, according to an embodiment.
Figure 9B:
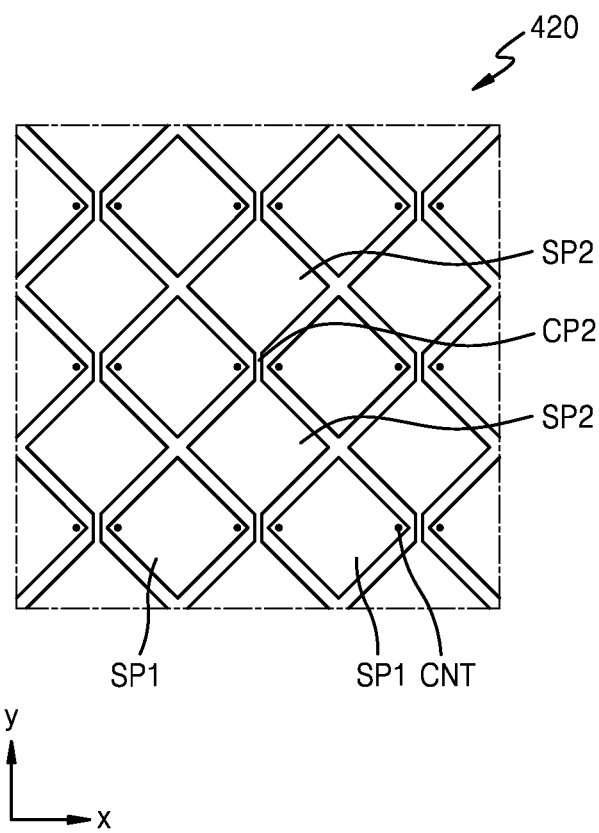
Figure 9C:
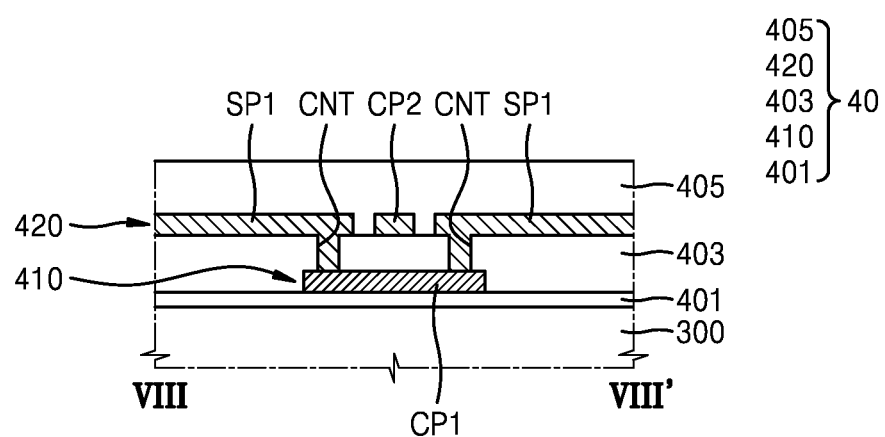
FIG. 9C is a cross-sectional view of the input sensing layer of FIGS. 9A and 9B, according to an embodiment.

FIGS. 9A and 9B are respective plan views of a first conductive layer 410 and a second conductive layer 420 of an input sensing layer (e.g., the input sensing layer 40 of FIG. 8), according to an embodiment. FIG. 9C is a cross-sectional view of the input sensing layer 40 of FIGS. 9A and 9B taken along line VIII-VIII' of FIG. 8, according to an embodiment.

Referring to FIGS. 9A and 9B, the first sensing electrode SP1 and the second sensing electrode SP2 may be disposed on the same layer as each other. For example, the first conductive layer 410 may include the first connection electrode CP1 (refer to FIG. 9A), and the second conductive layer 420 may include the first sensing electrode SP1, the second sensing electrode SP2, and the second connection electrode CP2 (refer to FIG. 9B).

The second sensing electrodes SP2 may be connected to each other by the second connection electrode CP2, which is disposed on the same layer. For example, the second sensing electrodes SP2 and the second connection electrode CP2 may be disposed on the second conductive layer 420 (refer to FIG. 9B). The first sensing electrodes SP1 may be disposed in the x direction, and may be connected to each other by the first connection electrode CP1, which is disposed on a different layer. For example, the first sensing electrodes SP1 may be disposed on the second conductive layer 420 (refer to FIG. 9B), and the first connection electrode CP1 may be disposed on the first conductive layer 410 (refer to FIG. 9A).

Referring to FIG. 9C, a middle insulating layer 403 may be disposed between the first conductive layer 410 and the second conductive layer 420. The first sensing electrodes SP1 disposed in the second conductive layer 420 may be connected to the first connection electrode CP1 disposed in the first conductive layer 410 via a contact hole CNT in the middle insulating layer 403.

The second conductive layer 420 may be covered by an upper insulating layer 405, and a lower insulating layer 401 may be disposed under the first conductive layer 410. The lower and middle insulating layers 401 and 403 may be inorganic insulating layers such as, for example, silicon nitride, or organic insulating layers.

The upper insulating layer 405 may be an organic insulating layer or an inorganic insulating layer. The first and second conductive layers 410 and 420 may include a metal layer or a transparent conductive layer. The metal layer may include, for example, molybdenum (Mo), mendelevium (Mb), silver (Ag), titanium (Ti), copper (Cu), aluminum (Al), and an alloy thereof. The transparent conductive layer may include transparent conductive oxide such as, for example, ITO, IZO, ZnO, indium tin zinc oxide (ITZO), etc. In addition, the transparent conductive layer may include a conductive polymer such as, for example, PEDOT, metal nanowire, carbon nanotube, graphene, etc.

In the embodiment of FIG. 9C, the lower insulating layer 401 is disposed between the thin film encapsulation layer 300 and the first conductive layer 410. In an embodiment, the lower insulating layer 401 may be omitted, and the first conductive layer 410 may be directly disposed on the thin film encapsulation layer 300.

Figure 10A:
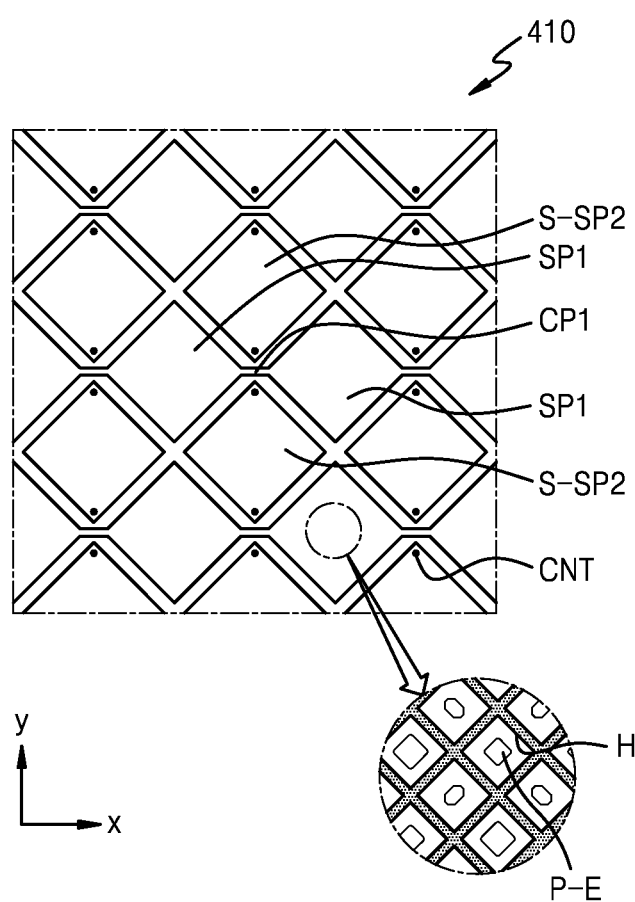
FIGS. 10A and 10B are respective plan views of a first conductive layer and a second conductive layer of an input sensing layer, according to an embodiment.
Figure 10B:
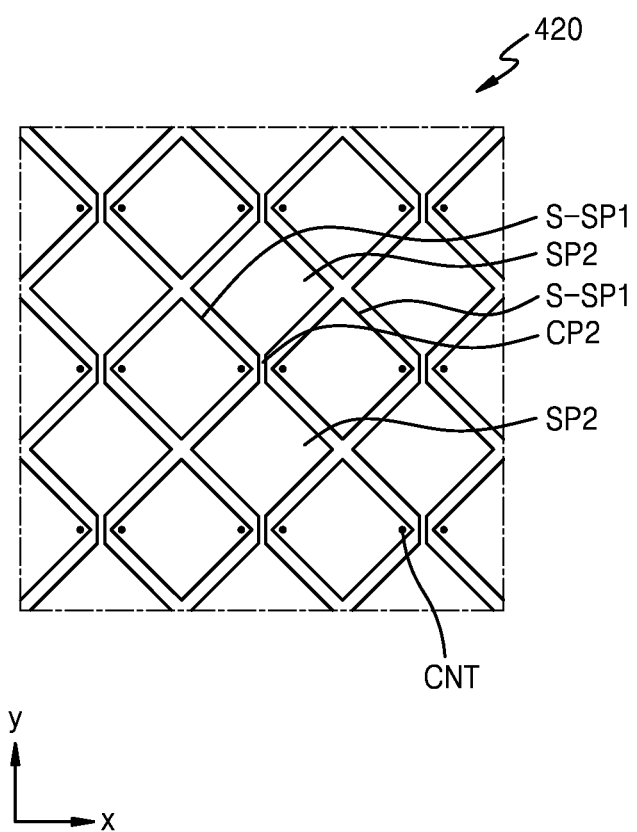
Figure 10C:
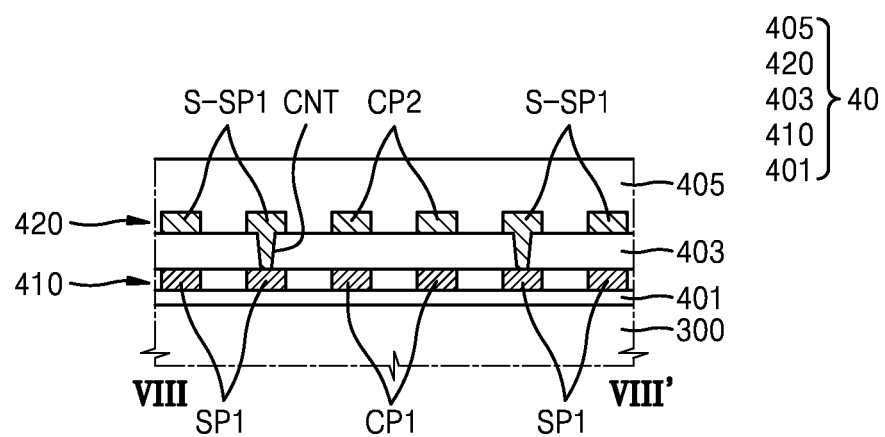
FIG. 10C is a cross-sectional view of the input sensing layer of FIGS. 10A and 10B, according to an embodiment.

FIGS. 10A and 10B are respective plan views of the first conductive layer 410 and the second conductive layer 420 of an input sensing layer (e.g., the input sensing layer 40 of FIG. 8), according to an embodiment. FIG. 10C is a cross-sectional view of the input sensing layer 40 of FIGS. 10A and 10B taken along line VIII-VIII' of FIG. 8, according to an embodiment.

Referring to FIGS. 10A and 10B, the first conductive layer 410 includes the first sensing electrodes SP1 and the first connection electrode CP1 connecting the first sensing electrodes SP1, and the second conductive layer 420 includes the second sensing electrodes SP2 and the second connection electrode CP2 connecting the second sensing electrodes SP2. The first conductive layer 410 may further include a second auxiliary sensing electrode S-SP2, which is connected to the second sensing electrode SP2, and the second conductive layer 420 may further include a first auxiliary sensing electrode S-SP1, which is connected to the first sensing electrode SP1.

Referring to FIG. 10A, each of the first sensing electrodes SP1 may have a mesh structure including a plurality of holes H. A hole H may overlap an emission area P-E of a pixel. The second sensing electrode SP2, the first auxiliary sensing electrode S-SP1, and the second auxiliary sensing electrode S-SP2 may also have a mesh structure including a plurality of holes corresponding to the emission area P-E of the pixel, as shown in FIG. 10A.

Referring to FIG. 10C, the first auxiliary sensing electrode S-SP1 may be connected to the first sensing electrode SP1 via the contact hole CNT in the middle insulating layer 403. Such a structure may decrease resistance of the first sensing electrode SP1. Similarly, the second sensing electrode SP2 may be connected to the second auxiliary sensing electrode S-SP2 via the contact hole CNT in the middle insulating layer 403.

The lower and middle insulating layers 401 and 403 may be inorganic insulating layers such as, for example, silicon nitride, or organic insulating layers, and the upper insulating layer 405 may be an organic insulating layer or an inorganic insulating layer.

The first and second conductive layers 410 and 420 may include a metal layer or a transparent conductive layer. The metal layer may include, for example, molybdenum (Mo), mendelevium (Mb), silver (Ag), titanium (Ti), copper (Cu), aluminum (Al), and an alloy thereof, and may have a single-layer or multilayer structure including the above-described metal. For example, the first and second conductive layers 410 and 420 may be metal layers including three sub-layers of Ti/Al/Ti. The transparent conductive layer may include, for example, a transparent conductive oxide, a conductive polymer, a metal nanowire, graphene, etc., as described above.

Figure 11A:
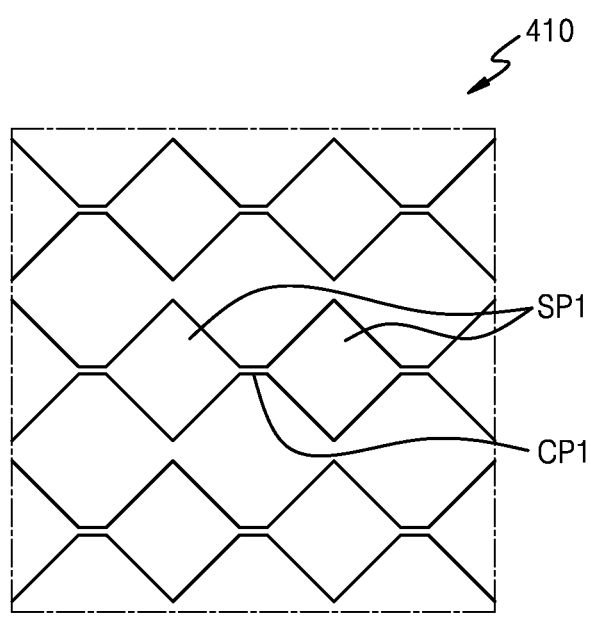
FIGS. 11A and 11B are respective plan views of a first conductive layer and a second conductive layer of an input sensing layer, according to an embodiment.
Figure 11B:
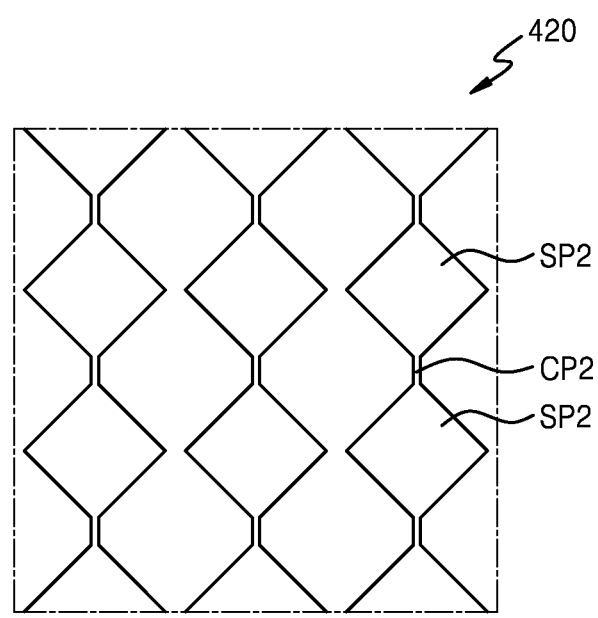
Figure 11C:
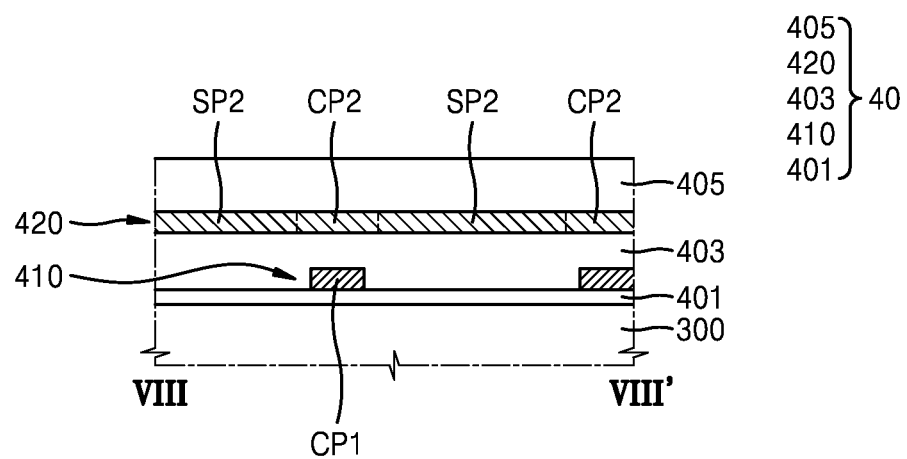
FIG. 11C is a cross-sectional view of the input sensing layer of FIGS. 11A and 11B, according to an embodiment.

FIGS. 11A and 11B are respective plan views of the first conductive layer 410 and the second conductive layer 420 of an input sensing layer (e.g., the input sensing layer 40 of FIG. 8), according to an embodiment. FIG. 11C is a cross-sectional view of the input sensing layer 40 of FIGS. 11A and 11B taken along line VIII-VIII' of FIG. 8, according to an embodiment.

Referring to FIGS. 11A and 11B, the first conductive layer 410 includes the first sensing electrodes SP1 and the first connection electrode CP1 connecting the first sensing electrodes SP1, and the second conductive layer 420 includes the second sensing electrodes SP2 and the second connection electrode CP2 connecting the second sensing electrodes SP2.

Referring to FIG. 11C, the middle insulating layer 403 may be disposed between the first conductive layer 410 and the second conductive layer 420. The middle insulating layer 403 does not include a contact hole, and the first and second sensing electrodes SP1 and SP2 may be electrically insulated from each other with the middle insulating layer 403 disposed therebetween.

The second conductive layer 420 may be covered by the upper insulating layer 405. The lower insulating layer 401 including an inorganic material or an organic material may be further included under the first conductive layer 410. The middle and upper insulating layers 403 and 405 may be organic insulating layers or inorganic insulating layers.

The first and second conductive layers 410 and 420 may include a metal layer or a transparent conductive layer. The metal layer may include, for example, molybdenum (Mo), mendelevium (Mb), silver (Ag), titanium (Ti), copper (Cu), aluminum (Al), and an alloy thereof. The transparent conductive layer may include a transparent conductive oxide such as, for example, ITO, IZO, ZnO, ITZO, etc. In addition, the transparent conductive layer may include a conductive polymer such as, for example, PEDOT, metal nanowire, graphene, etc.

Figure 12:
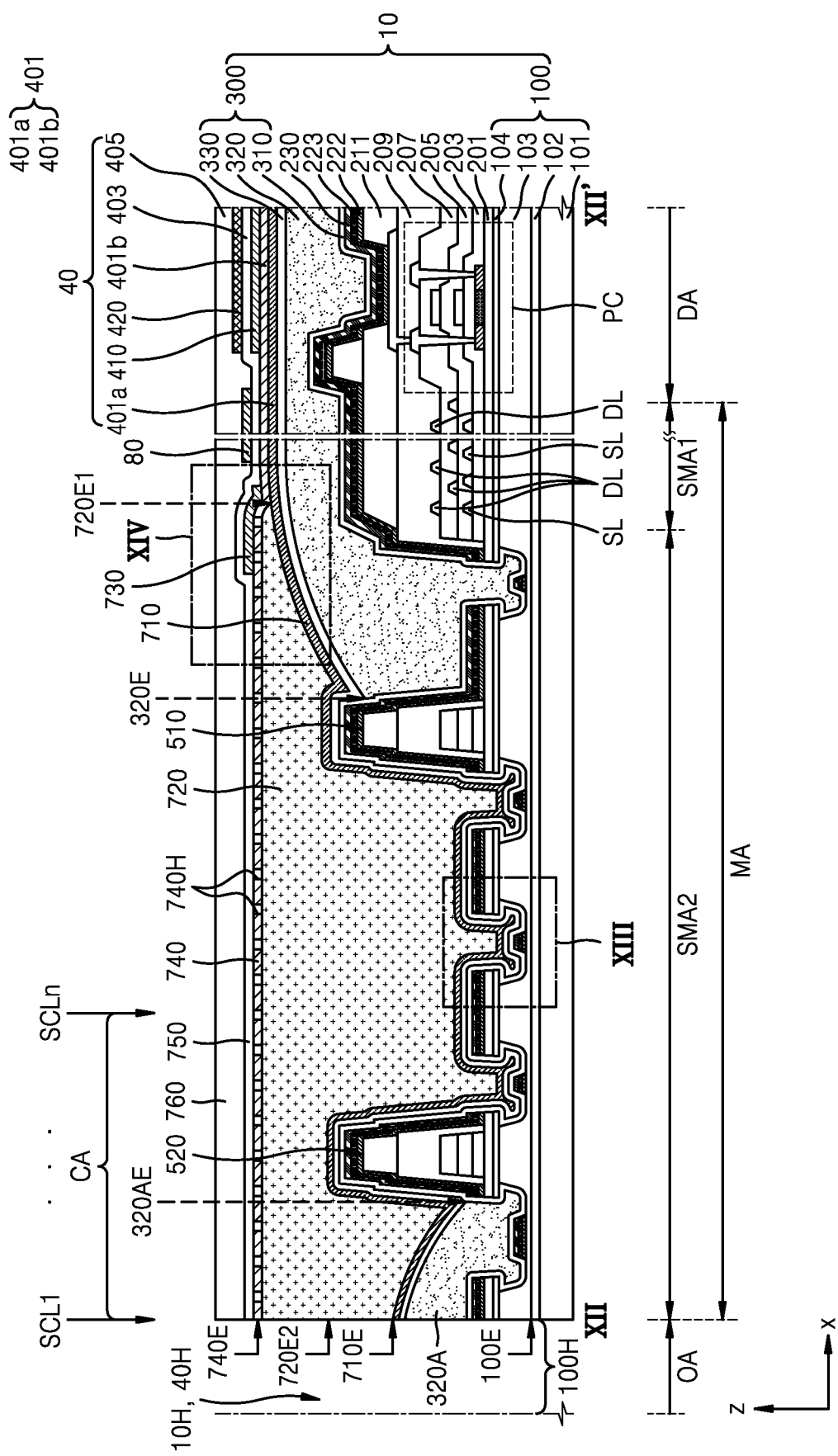
FIG. 12 is a cross-sectional view of a display apparatus, according to an embodiment.
Figure 13:
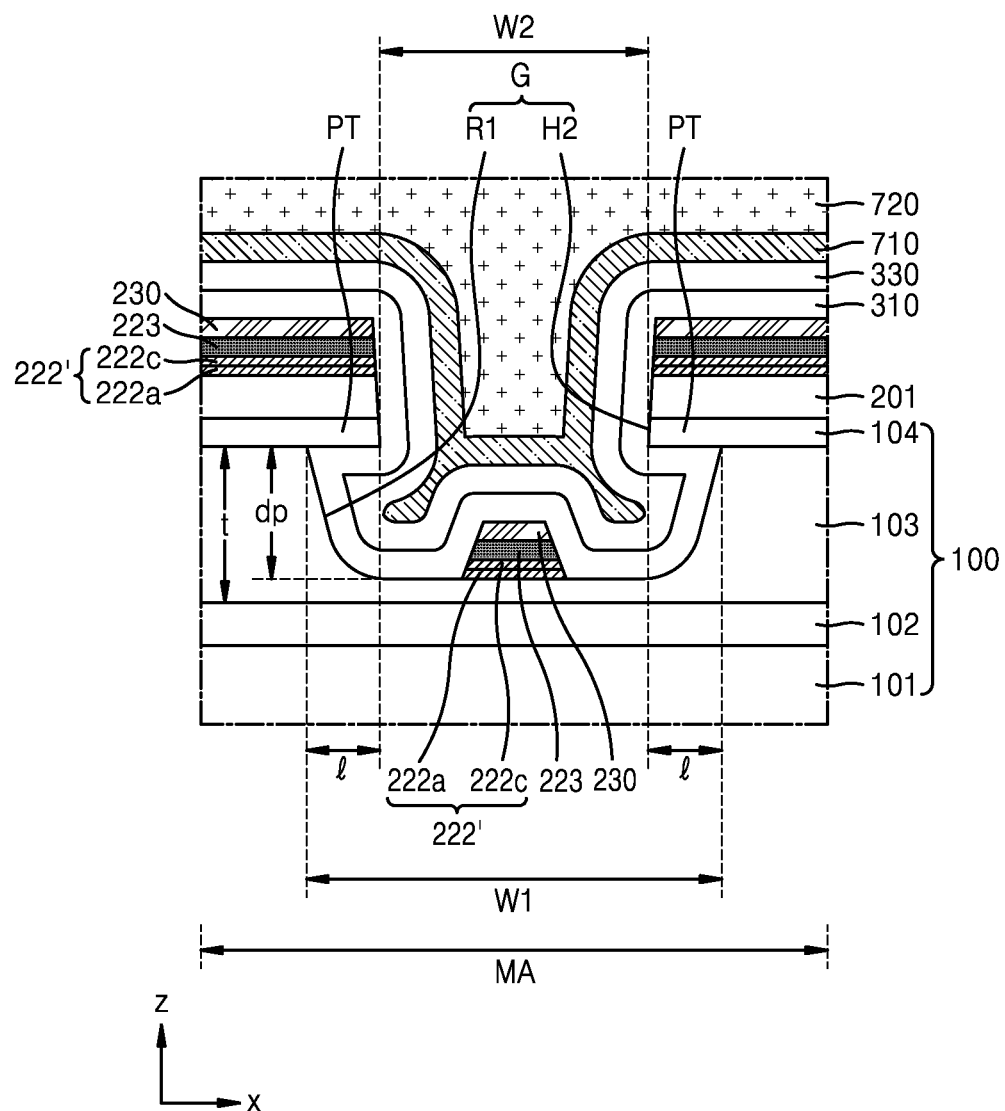
FIG. 13 is a cross-sectional view of portion XIII of FIG. 12, according to an embodiment.
Figure 14:
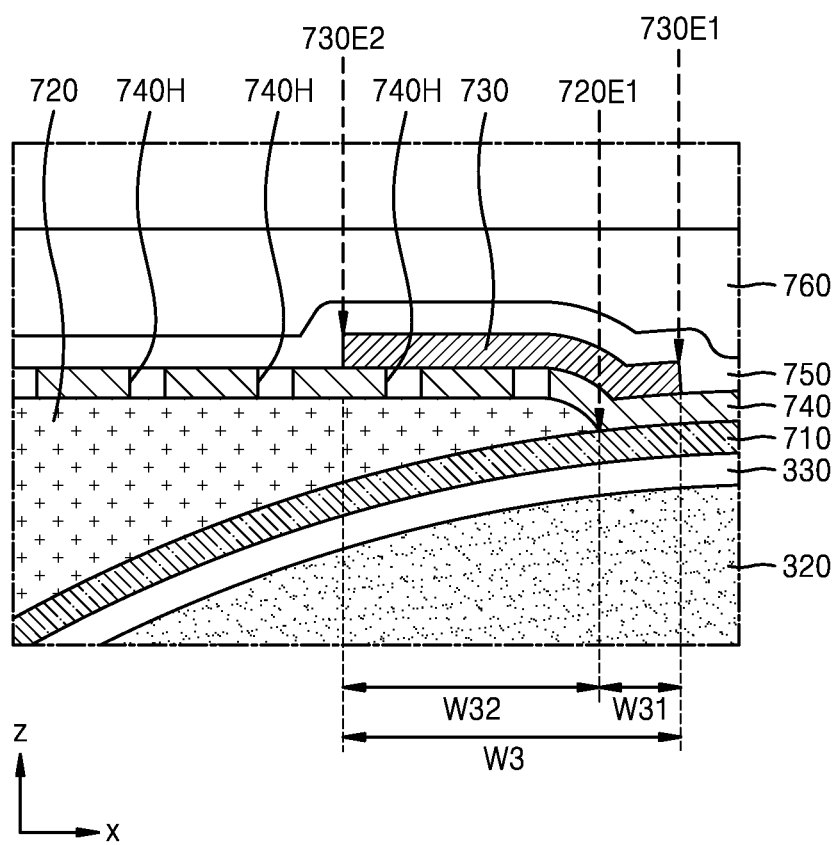
FIG. 14 is a cross-sectional view of a display apparatus according to an embodiment, and illustrates portion XIV of FIG. 12.
Figure 15:
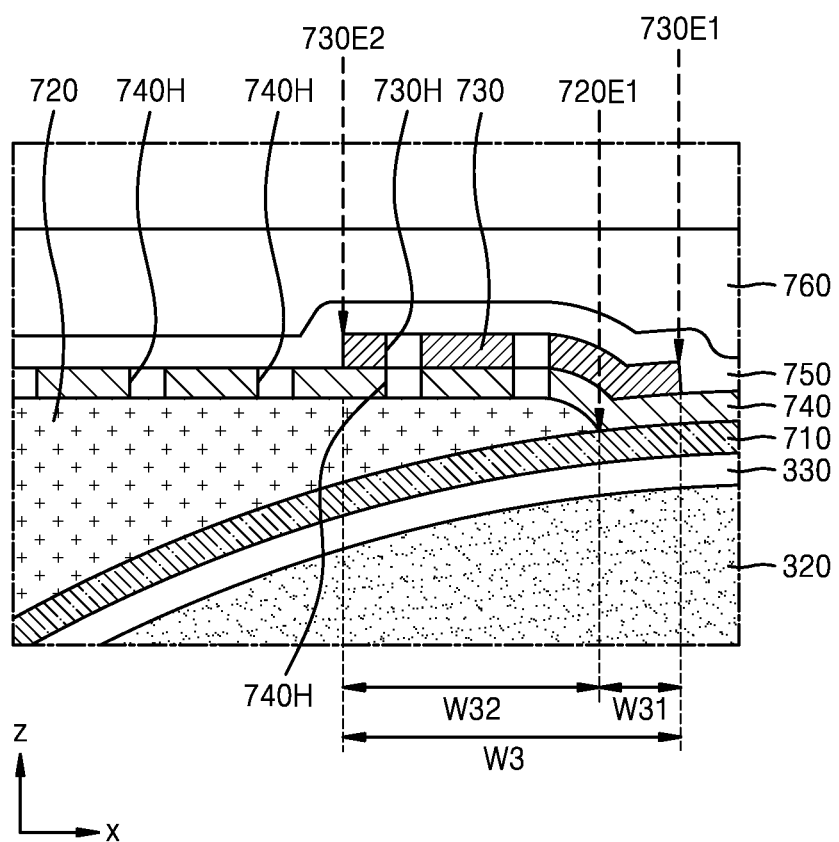
FIGS. 15 and 16 are cross-sectional views of display apparatuses according to embodiments, and illustrate a periphery of a cover layer.
Figure 16:
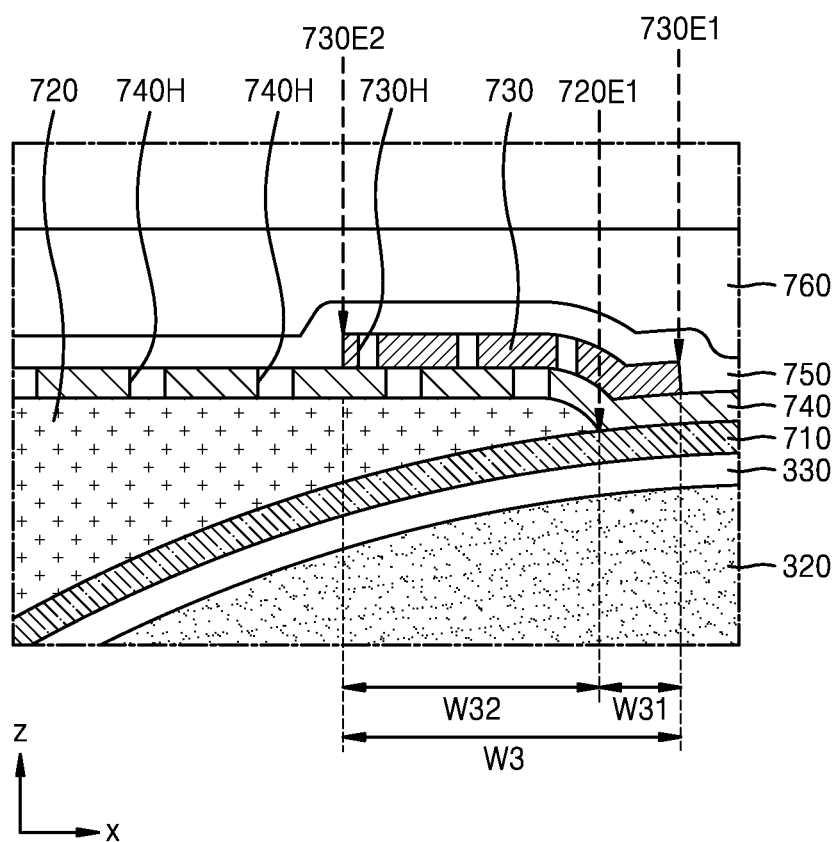
Figure 17:
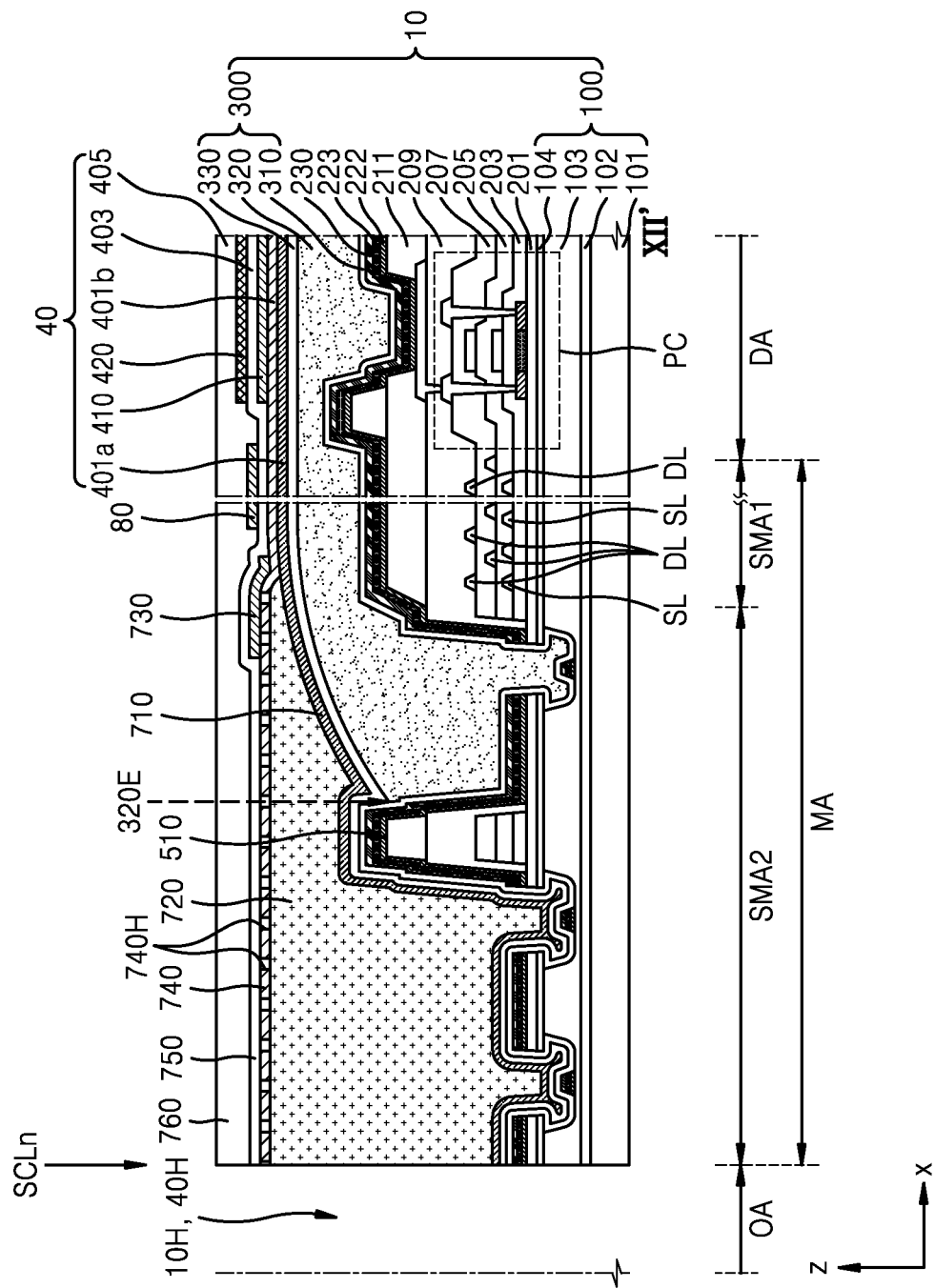
FIG. 17 is a cross-sectional view of a display apparatus, according to an embodiment.

FIG. 12 is a cross-sectional view of a display apparatus according to an embodiment, taken along line XII-XII' of FIG. 6. FIG. 13 is a cross-sectional view of portion XIII of FIG. 12, according to an embodiment. FIG. 14 is a cross-sectional view of a display apparatus according to an embodiment, and illustrates portion XIV of FIG. 12. FIGS. 15 and 16 are cross-sectional views of display apparatuses according to embodiments, and illustrate a periphery of a cover layer 730. FIG. 17 is a cross-sectional view of a display apparatus, according to an embodiment.

Referring to FIG. 12, the display panel 10 may include the first opening 10H corresponding to the first area OA.

The second area DA includes the pixel circuit PC disposed on the substrate 100, the pixel electrode 221 connected to the pixel circuit PC, and the intermediate layer 222 and the opposite electrode 223 sequentially stacked on the pixel electrode 221.

The substrate 100 may include multiple layers. For example, the substrate 100 may include a first base layer 101, a first barrier layer 102, a second base layer 103, and a second barrier layer 104, which are sequentially stacked.

Each of the first and second base layers 101 and 103 may include polymer resin. For example, the first and second base layers 101 and 103 may include polymer resin such as polyethersulfone, polyacrylate, polyetherimide, polyethylene naphthalate, polyethylene terephthalate, polyphenylene sulfide, polyarylate, polyimide, polycarbonate, cellulose triacetate and/or cellulose acetate propionate. The above-described polymer resin may be transparent.

Each of the first and second barrier layers 102 and 104, which is a barrier layer that may prevent permeation of an external foreign material, may have a single-layer or multilayer structure including an inorganic material such as, for example, silicon nitride ($SiN_x$) and/or silicon oxide ($SiO_x$).

The pixel circuit PC is on the substrate 100 and includes, for example, a thin film transistor and a storage capacitor. An organic light-emitting diode including the pixel electrode 221, an emission layer of the intermediate layer 222, and the opposite electrode 223 emits predetermined light and is covered by the thin film encapsulation layer 300. Components disposed in the second area DA are the same as those described above with reference to FIG. 7, and for convenience of description, a further description thereof is omitted.

Referring to FIG. 12, the third area MA may include a first sub-middle area SMA1 relatively adjacent to the second area DA, and a second sub-middle area SMA2 relatively adjacent to the first area OA or the first opening 10H. For example, the first sub-middle area SMA1 is closer to the second area DA than it is to the first area OA, and the second sub-middle area SMA2 is closer to the first area OA than it is to the second area DA.

The first sub-middle area SMA1 may be an area in which signal lines such as, for example, the data lines DL described above with reference to FIG. 5, pass through. The data lines DL shown in FIG. 12 may correspond to data lines detouring around the first area OA. The first sub-middle area SMA1 may be a line area or a detour area in which the data lines DL pass through. In an embodiment, a width of the first sub-middle area SMA1 may be less than or greater than that of the second sub-middle area SMA2. In an embodiment, the width of the first sub-middle area SMA1 may be substantially the same as that of the second sub-middle area SMA2.

As shown in FIG. 12, the data lines DL may be alternately disposed with an insulating layer disposed therebetween. For example, a first group of data lines DL may be disposed on the first interlayer insulating layer 205, the second interlayer insulating layer 207 may be disposed on top of the first group of data lines DL, and a second group of data lines DL may be disposed on top of the second interlayer insulating layer 207. Data lines DL of the first and second groups may be disposed in an alternating fashion. When neighboring data lines DL are respectively disposed above and below with the insulating layer (e.g. the second interlayer insulating layer 207) disposed therebetween, a gap (pitch) between the neighboring data lines DL may decrease, and a width of the third area MA may decrease.

In an embodiment, the data lines DL may be disposed on the same insulating layer (e.g. the second interlayer insulating layer 207). Although FIG. 12 shows the data lines DL disposed in the first sub-middle area SMA1, scan lines detouring the first area OA, as described above with reference to FIG. 5, may also be disposed in the first sub-middle area SMA1.

A shield layer 80 may be disposed on the data lines DL and/or the scan lines located in the first sub-middle area SMA1. The shield layer 80 may overlap the data lines DL and/or the scan lines, thus preventing the data lines DL and/or the scan lines from being visible to the user. In an embodiment, the shield layer 80 may include metal.

The second sub-middle area SMA2 is a groove area including a plurality of grooves G. Although FIG. 12 shows five grooves G disposed in the second sub-middle area SMA2, embodiments are not limited thereto, and the number of grooves G may variously change.

Each of the grooves G may be in a multilayer film including a first layer and a second layer including different from materials from each other. For example, in an embodiment, the groove G may be disposed in sub-layers of the substrate 100, as shown in FIG. 12.

Referring to FIGS. 12 and 13, the groove G may be formed by removing a portion of the second barrier layer 104 and a portion of the second base layer 103. A hole H2 formed through the second barrier layer 104 and a recess R1 formed in the second base layer 103 may be spatially connected to form the groove G. The second base layer 103 may correspond to the first layer of the multilayer film described above, and the second barrier layer 104 may correspond to the second layer of the multilayer film.

During a process of forming the groove G, a portion of the buffer layer 201 disposed on the second barrier layer 104 may be removed together with the second barrier layer 104 to form the hole H2. Although the buffer layer 201 and the second barrier layer 104 are described herein as separate components, in an embodiment, the buffer layer 201 disposed on the substrate 100 may be a sub-layer of the second barrier layer 104 having a multilayer structure.

A width of a portion of the groove G passing the second barrier layer 104, for example, the hole H2, may be less than that of a portion of the groove G passing the second base layer 103, for example, the recess R1. A width W2 (or a diameter) of the hole H2 may be less than a width W1 (or a diameter) of the recess R1, and the groove G may have an undercut cross-section.

A side surface of the second barrier layer 104 defining the hole H2 may protrude toward a center of the groove G more than a side surface of the second base layer 103 defining the recess R1. For example, as shown in FIG. 13, a distance from the side surface of the second barrier layer 104 adjacent to the groove G to the center of the groove G may be less than a distance from the side surface of the second base layer 103 adjacent to the groove G to the center of the groove G. Portions of the second barrier layer 104 protruding toward the center of the groove G may constitute a pair of eaves (or a pair of protruding tips or tips PT). Along with the second barrier layer 104, the buffer layer 201 may also constitute the pair of eaves.

The groove G may be formed before a process of forming the intermediate layer 222. A portion 222' of the intermediate layer 222, for example, the first function layer 222a and/or the second function layer 222c extending to the third area MA, is discontinuous around the groove G. For example, the groove G may create a break (or a disconnection) in the intermediate layer 222. Similarly, the opposite electrode 223 and the capping layer 230 including, for example, LiF, may be discontinuous around the groove G. For example, the groove G may create a break (or a disconnection) in the opposite electrode 223 and the capping layer 230. A length l of each of the pair of tips PT may be less than about 2.0 μm. For example, in an embodiment, the length l may be about 1.0 μm to about 1.8 μm.

Although FIGS. 12 and 13 show a bottom surface of the groove G located on an imaginary plane between a bottom surface and an upper surface of the second base layer 103, embodiments are not limited thereto. For example, in an embodiment, the bottom surface of the groove G may be located on the same plane as the bottom surface of the second base layer 103. For example, during an etching process for forming the groove G, a depth dp of the recess R1 may be substantially the same as a thickness t of the second base layer 103, and in this case, the bottom surface of the groove G may lie on the same plane as the bottom surface of the second base layer 103. The depth dp of the recess R1 may be about 2.0 μm or greater. When the depth dp of the recess R1 is substantially the same as the thickness t of the second base layer 103, the recess R1 may form a hole through the second base layer 103.

As shown in FIG. 12, the thin film encapsulation layer 300 covering display elements in the second area DA (a display area) may extend to cover the third area MA. For example, the first and second inorganic encapsulation layers 310 and 330 may extend to the third area MA.

The first and second inorganic encapsulation layers 310 and 330 may be formed, for example, by CVD, and may have relatively good step coverage compared to the portion 222' of the intermediate layer 222 or the opposite electrode 223. Accordingly, the first and second inorganic encapsulation layers 310 and 330 may each be continuous rather than discontinuous around the groove G.

The first inorganic encapsulation layer 310 may cover an inner surface of the groove G. The first and second inorganic encapsulation layers 310 and 330 may have different thicknesses from each other. For example, the first inorganic encapsulation layer 310 may have a thickness of about 1 μm, and the second inorganic encapsulation layer 330 may have a smaller thickness of about 0.7 μm. Alternatively, a thickness of the first inorganic encapsulation layer 310 and that of the second inorganic encapsulation layer 330 may be substantially the same as each other, or a thickness of the first inorganic encapsulation layer 310 may be greater than that of the second inorganic encapsulation layer 330.

Although FIGS. 12 and 13 show a structure in which the capping layer 230 including LiF is discontinuous around the groove G, embodiments are not limited thereto. For example, in an embodiment, when the capping layer 230 includes an inorganic material, like the first inorganic encapsulation layer 310, the capping layer 230 may continuously cover an inner surface of the groove G instead of being discontinuous around the groove G. That is, in this case, the groove G does not create a break (or a disconnection) in the capping layer 230.

As shown in FIG. 12, the organic encapsulation layer 320 may cover the second area DA and may have an end 320E disposed on a side of a first partition wall 510. The end 320E of the organic encapsulation layer 320 may contact the first partition wall 510.

The organic encapsulation layer 320 may be formed, for example, by spreading and curing monomers. The flow of monomers may be controlled by the first partition wall 510, and a thickness of the organic encapsulation layer 320 may be controlled by the first partition wall 510.

The organic encapsulation layer 320, for example, the end 320E of the organic encapsulation layer 320, may be spaced apart from the first area OA. As a result, external moisture permeating through the first opening 10H may be prevented from travelling to an organic light-emitting diode of the second area DA (a display area) via the organic encapsulation layer 320.

The first partition wall 510 may include a plurality of layers (e.g., a plurality of insulating layers). In this regard, FIG. 12 shows the first partition wall 510 having a stack structure of layers including the same material as the gate insulating layer 203, the first interlayer insulating layer 205, and the second interlayer insulating layer 207, and layers including the same material as the planarization insulating layer 209 and the pixel-defining film 211. However, embodiments are not limited thereto. For example, in an embodiment, the number of layers constituting the first partition wall 510 may be greater or less than the number of layers shown in FIG. 12.

An organic material layer 320A is adjacent to the first area OA, and is spaced apart from the organic encapsulation layer 320 by a predetermined distance. The organic material layer 320A may be formed during the same process as the organic encapsulation layer 320 and may include the same material as the organic encapsulation layer 320. As the flow of monomers is adjusted by the first partition wall 510 during a formation process of the organic encapsulation layer 320, the organic material layer 320A may be adjusted by a second partition wall 520, and an end 320AE of the organic material layer 320A may be disposed on a side of the second partition wall 520.

As shown in FIG. 12, the first inorganic encapsulation layer 310 and the second inorganic encapsulation layer 330 may be located over the third area MA while contacting each other.

When a contact area between the first inorganic encapsulation layer 310 and the second inorganic encapsulation layer 330 is about equal to or greater than a certain value, the first and second inorganic encapsulation layers 310 and 330 or a surrounding layer, for example, a planarization layer 720 described below, may be lifted due to stresses of the first inorganic encapsulation layer 310 and the second inorganic encapsulation layer 330. However, the contact area between the first and second inorganic encapsulation layers 310 and 330 may be decreased by arranging the organic material layer 320A as shown in FIG. 12, thus, preventing or reducing such lifting.

When the organic material layer 320A spaced apart from the organic encapsulation layer 320 is disposed, the first and second inorganic encapsulation layers 310 and 330 may contact each other between the end 320E of the organic encapsulation layer 320 and the end 320AE of the organic material layer 320A.

The planarization layer 720 may be disposed in the third area MA.

The planarization layer 720 may be an organic insulating layer. The planarization layer 720 may include a polymer-based material. The planarization layer 720 may include, for example, silicone-based resin, acrylic resin, epoxy-based resin, PI, polyethylene, etc. The above-described polymer-based material may be transparent.

In an embodiment, the planarization layer 720 may include a different material from the organic encapsulation layer 320. For example, in an embodiment, the organic encapsulation layer 320 may include silicone-based resin, and the planarization layer 720 may include acrylic resin. In an embodiment, the organic encapsulation layer 320 and the planarization layer 720 may include the same material as each other.

The planarization layer 720 may cover at least one groove G in the third area MA. The planarization layer 720 may increase flatness of the display panel 10 around the first area OA by covering at least an area that is not covered by the organic encapsulation layer 320 in the third area MA. Accordingly, problems such as separation or detachment of the input sensing layer 40 (of FIG. 2) and/or the optical function layer 50 (of FIG. 2) disposed on the display panel 10 may be prevented or reduced. A portion of the planarization layer 720 may overlap the organic encapsulation layer 320. An end of the planarization layer 720, for example, a first end 720E1 adjacent to the second area DA, may be disposed on the organic encapsulation layer 320. For example, the first end 720E1 of the planarization layer may overlap the thin film encapsulation layer 300.

The planarization layer 720 may be formed over the third area MA through, for example, exposure and development processes. During some of formation processes (e.g., a washing process) of the planarization layer 720, when an external foreign material, for example, moisture, travels in a side direction of the display panel 10 (e.g. a direction parallel to the xy plane), an organic light-emitting diode of the second area DA may be damaged. However, according to embodiments, the above-described problem caused by permeation of moisture during and after the formation processes of the planarization layer 720 and/or lifting of a surrounding film may be prevented or reduced by arranging insulating layers, for example, a first insulating layer 710 and a second insulating layer 740, under and on the planarization layer 720, respectively.

The first insulating layer 710 may be disposed directly under the planarization layer 720. For example, the first insulating layer 710 may contact the planarization layer 720, and no other layers may be present between the first insulating layer 710 and the planarization layer 720. The first insulating layer 710 may include an inorganic insulating material such as, for example, silicon oxide, silicon nitride, or silicon oxynitride.

The first insulating layer 710 may directly contact the thin film encapsulation layer 300. For example, the first insulating layer 710 may directly contact an upper surface of the second inorganic encapsulation layer 330.

The first insulating layer 710 may include the same material as the second inorganic encapsulation layer 330 or may include a different material from the second inorganic encapsulation layer 330. Even though the first insulating layer 710 includes the same material as the second inorganic encapsulation layer 330, for example, silicon nitride, a detailed composition ratio (e.g. the content ratio of silicon and nitrogen) may be different, and there may be an interface between the first insulating layer 710 and the second inorganic encapsulation layer 330. A thickness of the first insulating layer 710 may be less than that of the second inorganic encapsulation layer 330. Alternatively, the thickness of the first insulating layer 710 may be substantially the same as or greater than that of the second inorganic encapsulation layer 330.

The second insulating layer 740 may be disposed on the planarization layer 720, for example, directly on the planarization layer 720. The second insulating layer 740 may include an inorganic insulating material such as, for example, silicon oxide, silicon nitride, or silicon oxynitride.

The first insulating layer 710 and the second insulating layer 740 may include the same material as each other or may include different materials from each other. A thickness of the second insulating layer 740 may be greater than that of the first insulating layer 710. Alternatively, the thickness of the second insulating layer 740 may be less than or substantially the same as that of the first insulating layer 710.

The planarization layer 720 may have a step with respect to a lower layer thereof. Referring to FIG. 14, the first end 720E1 of the planarization layer 720 may have a step with respect to a lower layer thereof, for example, an upper surface of the first insulating layer 710. During an operation of manufacturing the display panel 10 and/or an operation of using the display panel 10 after manufacturing, to prevent the first end 720E1 of the planarization layer 720 from being separated from a lower layer thereof or being lifted due to the above step, the first end 720E1 of the planarization layer 720 may be covered by the second insulating layer 740 and/or the cover layer 730.

In an embodiment, the cover layer 730 may entirely overlap the first end 720E1 of the planarization layer 720, and may partially overlap the first insulating layer 710 and the second insulating layer 740, as shown in FIG. 14.

The cover layer 730 may include a different material from the first and second insulating layers 710 and 740. For example, the cover layer 730 may include the same material as the first conductive layer 410 and/or the second conductive layer 420 of the input sensing layer 40 located in the second area DA. In an embodiment, the cover layer 730 may include a conductive material such as metal.

A third width W3 of the cover layer 730 may be tens of μm to hundreds of μm. For example, the third width W3 of the cover layer 730 may be about 50 μm to about 500 μm, about 50 μm to about 400 μm, about 50 μm to about 300 μm, about 50 μm to about 200 μm, about 50 μm to about 100 μm, or about 60 μm to about 100 μm.

The cover layer 730 may be disposed on the planarization layer 720. For example, the cover layer 730 may be disposed directly on the second insulating layer 740 covering the planarization layer 720.

To prevent the first end 720E1 of the planarization layer 720 from being separated from a lower layer thereof or being lifted due to the above step, an upper portion of the planarization layer 720 is covered by the second insulating layer 740, and the cover layer 730 is formed close to the first end 720E1 of the planarization layer 720. However, gas components generated in the planarization layer 720 may accumulate and cause lifting of the cover layer 730.

By forming a plurality of through holes 740H in the second insulating layer 740 directly contacting the planarization layer 720, according to embodiments, outgassing of the planarization layer 720 may be facilitated, and thus, lifting of the cover layer 730 may be prevented or reduced.

For example, according to embodiments, each of the through holes 740H is not filled with another material. As a result, outgassing of the planarization layer 720 may be facilitated through the through holes 740H, and lifting of the cover layer 730 may be prevented or reduced. For example, although some of the material used to form the layer disposed directly above the through holes 740H may enter the through holes 740H, the through holes 740H are not entirely filled, and remain at least partially open, if not entirely open. As a result, gas released by the planarization layer 720 may be released into the through holes 740H, which may decrease pressure, and thus, prevent or reduce lifting of the cover layer 730 that would otherwise be caused if the through holes 740H were not present.

In an embodiment, a first end 730E1 of the cover layer 730 is not disposed above the planarization layer 720 in a first portion of the cover layer 730 further extending beyond the first end 720E1 of the planarization layer 720 in a direction toward the second area DA, as shown in FIG. 14. A second end 730E2 of the cover layer 730 may be disposed above the planarization layer 720 in a second portion of the cover layer 730 extending over the planarization layer 720 in a direction toward the first area OA.

A width W31 of the first portion of the cover layer 730 may be less than a width W32 of the second portion of the cover layer 730. For example, the width W31 of the first portion of the cover layer 730 may be about 20 and the width W32 of the second portion of the cover layer 730 may be about 60 μm.

As shown in FIG. 14, in an embodiment, the first portion of the cover layer 730 having the width W31 does not cover the planarization layer 720, and the second portion of the cover layer 730 having the width W32 covers the planarization layer. Thus, in an embodiment, the width W31 of the first portion of the cover layer 730 that does not cover the planarization layer 720 is less than the width W32 of the second portion of the cover layer 730 that covers the planarization layer 720.

A third insulating layer 750 and a fourth insulating layer 760 may be disposed on the cover layer 730. The third insulating layer 750 may include an inorganic insulating material such as, for example, silicon oxide, silicon nitride, or silicon oxynitride. Alternatively, the third insulating layer 750 may include an organic insulating material. The fourth insulating layer 760 may include an inorganic insulating material or may include an organic insulating material. The fourth insulating layer 760 including an organic insulating material may have a substantially flat upper surface. The organic insulating material may be a photoresist (negative or positive), or may include a polymer-based organic material.

At least one of the first insulating layer 710, the second insulating layer 740, the third insulating layer 750, and the fourth insulating layer 760 may include the same material as an insulating layer included in the input sensing layer 40 described above with reference to FIGS. 8 to 11C.

In an embodiment, each of the first insulating layer 710, the second insulating layer 740, the third insulating layer 750, and the fourth insulating layer 760 may be formed together during the same process as at least one insulating layer of the input sensing layer 40 described above with reference to FIGS. 8 to 11C. For example, as shown in FIG. 12, the first insulating layer 710 may include the same material as a first sub-lower insulating layer 401a, which is a portion of the lower insulating layer 401 of the input sensing layer 40, and may be integrally formed with the first sub-lower insulating layer 401a of the input sensing layer 40. The second insulating layer 740 may include the same material as a second sub-lower insulating layer 401b, which is a portion of the lower insulating layer 401, and may be integrally formed with the second sub-lower insulating layer 401b. The third insulating layer 750 may include the same material as the middle insulating layer 403 of the input sensing layer 40 and may be integrally formed with the middle insulating layer 403. The fourth insulating layer 760 may include the same material as the upper insulating layer 405 of the input sensing layer 40 and may be integrally formed with the upper insulating layer 405. In an embodiment, the first insulating layer 710, the second insulating layer 740, and the third insulating layer 750 may include an inorganic insulating material, and the fourth insulating layer 760 may include an organic insulating material.

The first and second openings 10H and 40H of the display apparatus 1 may be formed, for example, by performing a cutting or scribing process after forming the above-described component and layers on the substrate 100.

In this regard, the cross-sectional structure of FIG. 12 may be understood as a cross-section of the display panel 10 manufactured by performing a cutting or scribing process along a first line SCL1. Ends of the layers disposed on the substrate 100 around the first area OA may be on the same vertical line as an end 100E of the substrate 100 defining the first opening 10H. For example, an end 710E of the first insulating layer 710, a second end 720E2 of the planarization layer 720, and an end 740E of the second insulating layer 740 may be on the same vertical line as the end 100E defining an opening 100H of the substrate 100. Similarly, ends of the first and second inorganic encapsulation layers 310 and 330, the organic material layer 320A, and the third and fourth insulating layers 750 and 760 may also be on the same vertical line as the end 100E of the substrate 100.

An area from the first line SCL1 to an $n^{th}$ line SCLn shown in FIG. 12 may be an area CA through which laser may pass during a cutting or scribing process of manufacturing processes of a display panel. That is, a cutting or scribing process may be performed along one of the first to $n^{th}$ lines SCL1 to SCLn, and a resulting cross-sectional structure may correspond to a structure of a display apparatus according to one or more embodiments.

Referring to FIGS. 15 and 16, according to embodiments, the cover layer 730 may include a second through hole 730H. The width of the second through hole 730H may be varied. In an embodiment, the second through hole 730H may overlap the first through hole 740H, as shown in FIG. 15. The second through hole 730H may entirely overlap the first through hole 740H (e.g., the second through hole 730H may be aligned with the first through hole 740H) as shown in FIG. 15, or the second through hole 730H may at least partially overlap the first through hole 740H. The second through hole 730H may have substantially the same size as the first through hole 740H. In an embodiment, the second through hole 730H does not overlap the first through hole 740H, as shown in FIG. 16.

According to embodiments, the through holes 730H and 740H are not filled with another material. As a result, outgassing of the planarization layer 720 may be facilitated through the through holes 730H and 740H. For example, although some of the material used to form the layer disposed directly above the through holes 730H and 740H may enter the through holes 730H and 740H, the through holes 730H and 740H are not entirely filled, and remain at least partially open, if not entirely open. As a result, gas released by the planarization layer 720 may be released into the through holes 730H and 740H, which may decrease pressure, and thus, prevent or reduce lifting of the cover layer 730 that would otherwise be caused if the through holes 730H and 740H were not present.

FIG. 17 shows a cross-sectional structure of the display panel 10 having a cutting or scribing process performed along the $n^{th}$ line SCLn. The cross-sectional structure(s) of a display panel having a cutting or scribing process performed along one of the first to $n^{th}$ lines SCL1 to SCLn shown in FIG. 12 may correspond to embodiments of the present application.

The cross-sectional structure shown in FIGS. 12 and 17 may be understood as a structure surrounding the first area OA. For example, as described above with reference to FIG. 6, the grooves G disposed between the first area OA and the second area DA may have a ring shape surrounding the first opening 10H and the first area OA. Similarly, on the plane, the planarization layer 720 of FIG. 12 may have a ring shape surrounding the first opening 10H and the first area OA, and in this regard, FIG. 18 shows the planarization layer 720.

Figure 18:
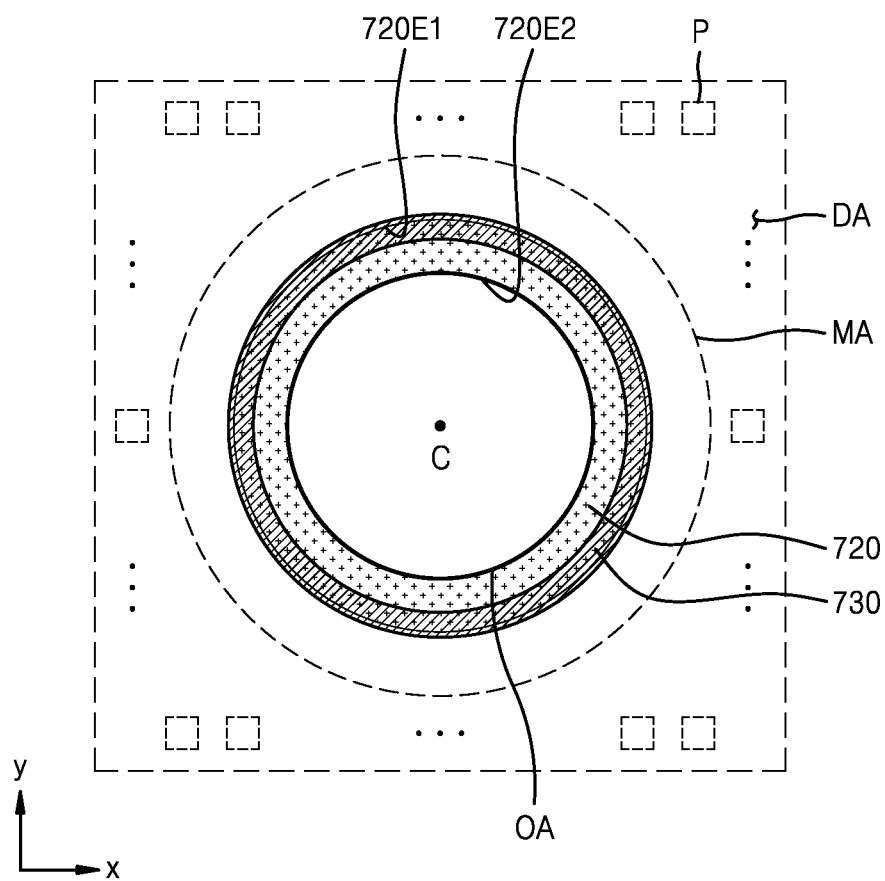
FIG. 18 is a plan view of a first area and a periphery thereof in a display apparatus, according to an embodiment.

FIG. 18 is a plan view of the first area OA and a periphery thereof in a display apparatus according to an embodiment, which is excerpted from the planarization layer 720 and the cover layer 730 for convenience of description.

Referring to FIG. 18, the planarization layer 720 may have a ring shape surrounding the first area OA. The planarization layer 720 may be disposed in the third area MA, and on the plane, the second end 720E2 of the planarization layer 720 may be substantially the same as an outline of the first area OA.

The cover layer 730 may at least partially cover the first end 720E1 of the planarization layer 720. In this regard, FIG. 18 shows the cover layer 730 having a ring shape surrounding the first area OA and entirely covering the first end 720E1 of the planarization layer 720. However, embodiments are not limited thereto. For example, in an embodiment, the cover layer 730 may partially cover the first end 720E1 of the planarization layer 720, may have a shape partially surrounding the first area OA on the plane.

As described above, the cover layer 730 may include the same material as one of the conductive layers included in the input sensing layer 40 (of FIG. 12), and may be on the same layer as one of the conductive layers included in the input sensing layer 40 (of FIG. 12). For example, the cover layer 730 may include the same material as the first conductive layer 410 of the input sensing layer 40 or the second conductive layer 420 of the input sensing layer 40, and may be disposed on the same layer as the first conductive layer 410 of the input sensing layer 40 or the second conductive layer 420 of the input sensing layer 40.

The cover layer 730 may include a metal layer. For example, the cover layer 730 may have a metal multilayer structure in which, for example, a titanium layer, an aluminum layer, and a titanium layer are sequentially stacked.

FIGS. 19A to 19D show various arrangements of through holes in the second insulating layer 740 and the cover layer 730, according to embodiments.

Figure 19A:
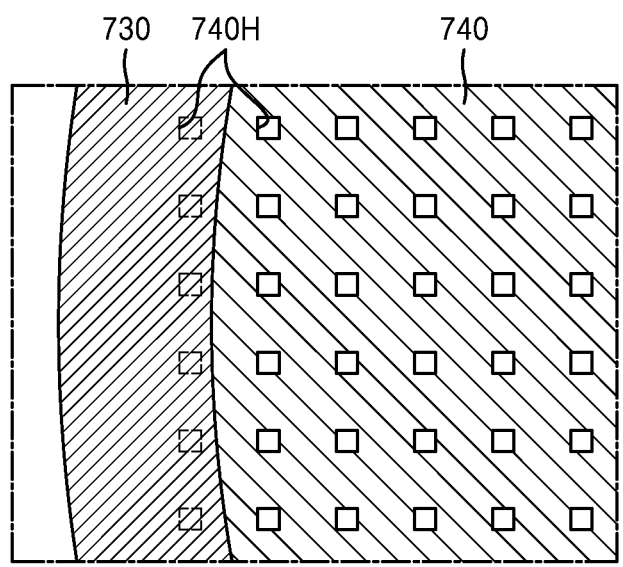
FIGS. 19A to 19D are schematic plan views of various arrangements of through holes formed in a second insulating layer and a cover layer in a display apparatus, according to embodiments.
Figure 19B:
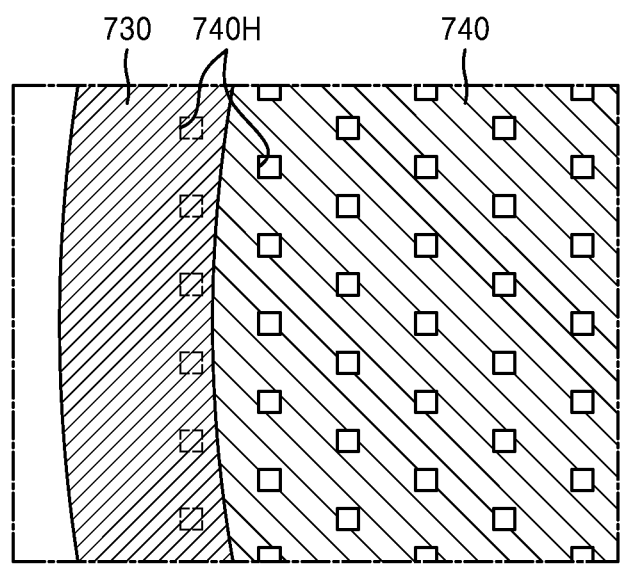

FIGS. 19A and 19B show embodiments in which only the second insulating layer 740 includes first through holes 740H. FIG. 19A shows the first through holes 740H disposed in columns in which the first through holes 740H are aligned with each other in adjacent columns. FIG. 19B shows the first through holes 740H disposed in columns in which the first through holes 740H are not aligned with each other in adjacent columns. In FIG. 19B, the first through holes 740H in alternating columns may be aligned with each other.

Figure 19C:
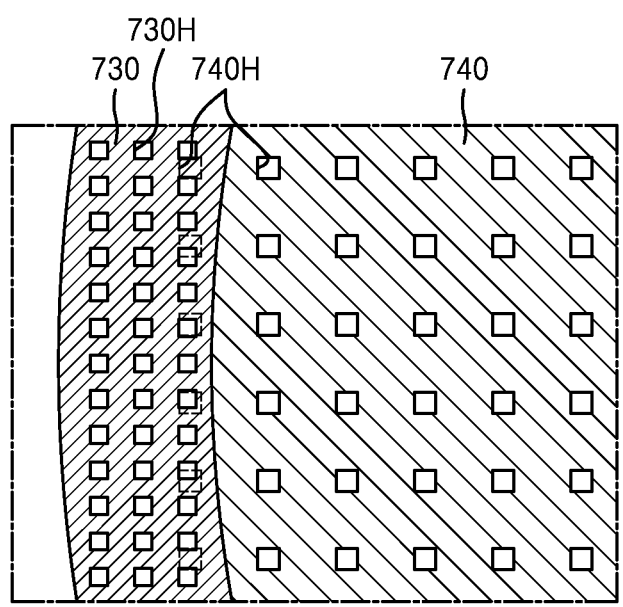
Figure 19D:
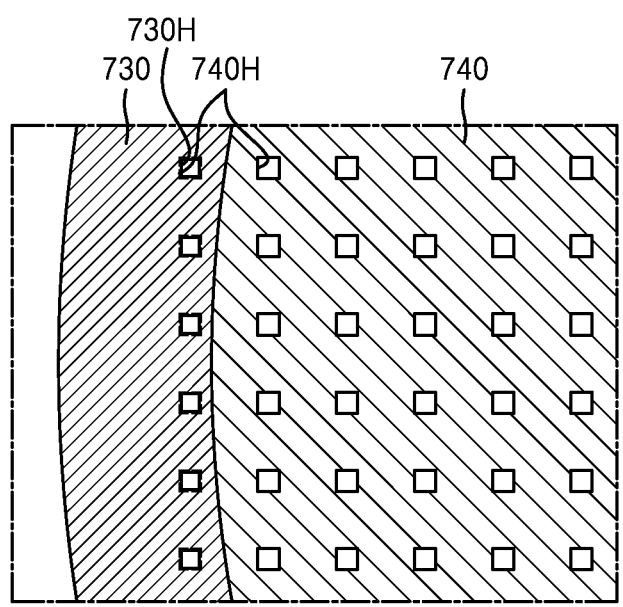

FIGS. 19B and 19C show embodiments in which the second insulating layer 740 includes the first through holes 740H and the cover layer 730 includes second through holes 730H. FIG. 19C shows some of the second through holes 730H overlapping the first through holes 740H, and some of the second through holes 730H not overlapping the first through holes 740H. FIG. 19D shows the second through holes 730H and the first through holes 740H entirely overlapping each other.

Although FIGS. 19A to 19D show through holes in a tetragonal shape, embodiments are not limited thereto. For example, in embodiments, the through holes may be variously modified to have, for example, a circular shape, an oval shape, a polygonal shape such as a triangular or tetragonal shape, a star shape, a diamond shape, an atypical shape, etc.

According to one or more embodiments, faults such as lifting or exfoliation of a film around an opening area may be prevented or reduced.

While one or more embodiments have been described herein with reference to the accompanying drawings, it will be understood by those of ordinary skill in the art that various changes in form and detail may be made therein without departing from the spirit and scope of the present disclosure, as defined by the following claims.

What is claimed is:
1. A display panel, comprising:
at least one opening;
a display area surrounding the at least one opening, wherein the display area comprises a plurality of display elements;
a first non-display area disposed between the at least one opening and the display area, wherein the first non-display area comprises a groove;
a thin film encapsulation layer covering the plurality of display elements;

a planarization layer disposed over the groove, wherein a first end of the planarization layer overlaps the thin film encapsulation layer;

a first insulating layer disposed over the thin film encapsulation layer;

a second insulating layer disposed over the planarization layer, wherein the second insulating layer comprises a first through hole; and a cover layer overlapping the first end of the planarization layer and partially overlapping the first insulating layer and the second insulating layer, wherein the first through hole is disposed above the planarization layer.

2. The display panel of claim 1, wherein the planarization layer comprises an organic insulating material.

3. The display panel of claim 1, wherein the cover layer comprises a conductive material.

4. The display panel of claim 1, wherein the cover layer comprises a second through hole.

5. The display panel of claim 4, wherein the first through hole and the second through hole at least partially overlap each other.

6. The display panel of claim 5, wherein the first through hole and the second through hole have substantially a same size.

7. The display panel of claim 1, wherein the first insulating layer comprises an inorganic insulating material.

8. The display panel of claim 1, wherein the second insulating layer comprises an inorganic insulating material.

9. The display panel of claim 1, wherein a width of a first portion of the cover layer that does not cover the planarization layer is less than a width of a second portion of the cover layer that covers the planarization layer.

10. The display panel of claim 1, wherein the encapsulation layer comprising an inorganic encapsulation layer and an organic encapsulation layer, the inorganic encapsulation layer of the thin film encapsulation layer covers the groove, and the first insulating layer covers the inorganic encapsulation layer.

11. The display panel of claim 1, further comprising:

a first partition wall disposed in the first non-display area, wherein the first partition wall comprises a plurality of insulating layers, wherein the planarization layer is disposed on the first partition wall.

12. The display panel of claim 1, further comprising a second non-display area surrounding the display area, wherein the second non-display area comprises a driver and/or a power line electrically connected to the a plurality of display elements of the display area.

13. The display panel of claim 1, wherein the first through hole comprises a plurality of through holes, in a plan view, the plurality of through holes are aligned with each other in adjacent columns.

14. The display panel of claim 1, wherein the first through hole comprises a plurality of through holes, in a plan view, the plurality of through holes are not aligned with each other in adjacent columns, but aligned with each other in an alternating columns.

15. A display panel, comprising:

at least one opening;

a display area surrounding the at least one opening, wherein the display area comprises a plurality of display elements;

a first non-display area disposed between the at least one opening and the display area;

a second non-display area surrounding the display area;

a thin film encapsulation layer covering the plurality of display elements;

a planarization layer disposed in the first non-display area, wherein a first end of the planarization layer overlaps the thin film encapsulation layer;

a first insulating layer disposed over the thin film encapsulation layer;

a second insulating layer disposed over and directly contacting the planarization layer, wherein the second insulating layer comprises a first through hole; and an input sensing layer disposed over the plurality of display elements.

16. The display panel of claim 15, wherein the input sensing layer comprises:

a first conductive layer comprising a first connection electrode;

a second conductive layer comprising a first sensing electrode, a second sensing electrode, and a second connection electrode; and an interlayer insulating layer disposed between the first conductive layer and the second conductive layer.

17. The display panel of claim 16, further comprising:

a cover layer overlapping the first end of the planarization layer, and partially overlapping the first insulating layer and the second insulating layer, wherein the cover layer is on a same layer as the first conductive layer or the second conductive layer.

18. The display panel of claim 17, wherein the cover layer comprises a same material as the first conductive layer or the second conductive layer.

19. The display panel of claim 17, wherein the interlayer insulating layer extends over the cover layer and overlaps the cover layer.

20. The display panel of claim 17, wherein the cover layer comprises a second through hole.

21. The display panel of claim 15, wherein the first non-display area comprises a groove, and the planarization layer is disposed over the groove.

22. The display panel of claim 21, wherein the thin film encapsulation layer comprises at least one inorganic encapsulation layer and at least one organic encapsulation layer, wherein the at least one inorganic encapsulation layer of the thin film encapsulation layer covers the groove.

23. The display panel of claim 15, wherein the second non-display area comprises a driver and/or a power line electrically connected to the a plurality of display elements of the display area.

* * * * *